United States Patent
Kim et al.

(10) Patent No.: US 12,101,902 B2
(45) Date of Patent: Sep. 24, 2024

(54) ELECTRONIC DEVICE WITH STRUCTURE TO REDUCE DAMAGE TO GLASS

(71) Applicant: Samsung Electronics Co., Ltd., Gyeonggi-do (KR)

(72) Inventors: Seonghoon Kim, Gyeonggi-do (KR); Kyungtae Kim, Gyeonggi-do (KR); Kwangtai Kim, Gyeonggi-do (KR); Donghyun Yeom, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 303 days.

(21) Appl. No.: 17/586,038

(22) Filed: Jan. 27, 2022

(65) Prior Publication Data

US 2022/0217863 A1    Jul. 7, 2022

Related U.S. Application Data

(63) Continuation of application No. PCT/KR2022/000176, filed on Jan. 5, 2022.

(30) Foreign Application Priority Data

Jan. 5, 2021   (KR) .......................... 10-2021-0001103

(51) Int. Cl.
*B32B 7/12*     (2006.01)
*B32B 17/10*    (2006.01)
(Continued)

(52) U.S. Cl.
CPC ................. *H05K 5/03* (2013.01); *B32B 7/12* (2013.01); *B32B 17/10018* (2013.01);
(Continued)

(58) Field of Classification Search
CPC .............. B32B 17/10; B32B 17/10018; B32B 17/1055; B32B 17/10779; B32B 2307/30;
(Continued)

(56) References Cited

U.S. PATENT DOCUMENTS 10,600,989 B1    3/2020  Ai et al.
10,686,028 B2    6/2020  Ahn et al.
(Continued)

FOREIGN PATENT DOCUMENTS

CN    111369897 A     7/2020
EP    3739427 A1    11/2020
(Continued)

OTHER PUBLICATIONS

International Search Report dated Mar. 31, 2022.
Written Opinion dated Mar. 31, 2022.
Extended European Search Report dated Mar. 22, 2024.

*Primary Examiner* — Lawrence D Ferguson
(74) *Attorney, Agent, or Firm* — Cha & Reiter, LLC

(57) ABSTRACT

According to certain embodiments, an electronic device comprises a first housing; a second housing; a hinge disposed between the first housing and the second housing such that the second housing is foldable at one end of the first housing; and a flexible display disposed on a surface of the first housing and a surface of the second housing, wherein the flexible display comprises a display panel, and a glass layer disposed on the display panel, such that the display panel is between the glass layer and the surface of the first housing and the surface of the second housing, wherein the glass layer comprises: a bendable portion configured to be flat in an unfolded state when the first housing and the second housing are disposed horizontally adjacent, and to be bent in a folded state when the first housing and the second housing are vertically adjacent; and a first flat portion adjacent to the bending portion to form a boundary and a second flat portion disposed to extend from the first flat portion to an edge of the glass layer, wherein the glass layer comprises a glass member, wherein the glass member has a first thickness in the second flat portion, has a second thickness at the center of the bending portion, and has a third (Continued)

thickness less than the first thickness and greater than the second thickness in a section between the first flat portion and the center of the bending portion, and wherein the thickness of the glass member gradually decreases from the first flat portion to the center of the bending portion forming a concave portion.

20 Claims, 21 Drawing Sheets

(51) Int. Cl.
*H05K 5/00* (2006.01)
*H05K 5/02* (2006.01)
*H05K 5/03* (2006.01)
*G02B 5/30* (2006.01)

(52) U.S. Cl.
CPC .... *B32B 17/1055* (2013.01); *B32B 17/10779* (2013.01); *H05K 5/0017* (2013.01); *H05K 5/0226* (2013.01); *B32B 2307/42* (2013.01); *B32B 2307/558* (2013.01); *B32B 2457/20* (2013.01); *G02B 5/3025* (2013.01)

(58) Field of Classification Search
CPC .......... B32B 2307/42; B32B 2307/558; B32B 2457/20; B32B 7/12; G02B 5/0221; G02B 5/30; G02B 5/3025; G02B 5/3033; G06F 1/1616; G06F 1/1637; G06F 1/1652; G06F 1/1656; G06F 1/1681; G09F 9/30; H04M 1/0214; H04M 1/0268; H04M 1/185; H05K 5/0017; H05K 5/0226; H05K 5/03

USPC ....................................................... 361/807

See application file for complete search history.

(56) References Cited

U.S. PATENT DOCUMENTS

| | | | |
|---|---|---|---|
| 10,847,735 | B2 | 11/2020 | Seo |
| 11,243,564 | B2* | 2/2022 | Kim ................. G06F 1/1656 |
| 11,886,238 | B2* | 1/2024 | Shin ................. G06F 1/1616 |
| 2018/0217639 | A1 | 8/2018 | Jones et al. |
| 2018/0364759 | A1 | 12/2018 | Ahn et al. |
| 2020/0266368 | A1 | 8/2020 | Park et al. |
| 2020/0310494 | A1 | 10/2020 | Ahn et al. |
| 2020/0324521 | A1 | 10/2020 | Park et al. |
| 2020/0329575 | A1 | 10/2020 | Park et al. |
| 2020/0353733 | A1 | 11/2020 | Kim et al. |
| 2021/0107826 | A1 | 4/2021 | Hwang et al. |
| 2021/0257582 | A1 | 8/2021 | Kim et al. |
| 2021/0315116 | A1 | 10/2021 | Sunwoo et al. |
| 2022/0015253 | A1 | 1/2022 | Park et al. |

FOREIGN PATENT DOCUMENTS

| | | |
|---|---|---|
| KR | 10-1620375 B1 | 5/2016 |
| KR | 10-1911698 B1 | 10/2018 |
| KR | 10-2019-0092657 A | 8/2019 |
| KR | 10-2111138 B1 | 5/2020 |
| KR | 10-2020-0083872 A | 7/2020 |
| KR | 10-2020-0101574 A | 8/2020 |
| KR | 10-2150390 B1 | 9/2020 |
| KR | 10-2020-0115092 A | 10/2020 |
| KR | 10-2167404 B1 | 10/2020 |
| KR | 10-2020-0124059 A | 11/2020 |
| KR | 10-2404670 B1 | 6/2022 |

* cited by examiner

ELECTRONIC DEVICE WITH STRUCTURE TO REDUCE DAMAGE TO GLASS

CROSS-REFERENCE TO RELATED APPLICATION(S)

This application is a continuation of International Application No. PCT/KR2022/000176, filed on Jan. 5, 2022, which claims priority to Korean Patent Application No. 10-2021-0001103, filed on Jan. 5, 2021 in the Korean Intellectual Property Office, the disclosures of which are herein incorporated by reference.

TECHNICAL FIELD

Certain embodiments of the disclosure relate to a foldable electronic device capable of reducing damage to glass.

BACKGROUND ART

Electronic devices are becoming slimmer, while maintaining or improving rigidity and strengthen. Moreover, electronic devices are being transformed from a uniform rectangular shape into a variety of shapes. For example, electronic devices may have a deformable structure or foldable structure. The foldable structure allows the user to have the benefit of both portability and a large screen. When the electronic device is being ported, the user can bend or fold the electronic device, thus reducing the dimensions of the electronic device. This makes easier to carry in a pocket or purse. However, when the user is using the electronic device, the user can unfold the electronic device thereby enjoying the increased screen size.

As part of the deformable structure, the electronic devices include a foldable electronic device including a flexible display that operates in such a manner that at least two housings are folded or unfolded with respect to each other, and various improvement measures according to the application of the flexible display are being prepared.

A foldable electronic device may include a hinge. The hinge movably couples the first and second housings to each other hinge. This foldable electronic device can operate in an in-folding and/or out-folding manner by the operation in which the first housing rotates in a range of 0 to 360 degrees with respect to the second housing through the hinge. The foldable electronic device may include a flexible display disposed to cross the first housing and the second housing when the foldable electronic device is in an open state of 180 degrees.

A glass layer of the flexible display may include UTG (ultra-thin glass) so that the glass layer is bendable. Compared to a transparent polyimide (PI) film, UTG has excellent visibility (transparency) and hardness (hardness of a surface), but may be easily broken or cracked by an external impact.

Meanwhile, in the foldable electronic device, a bent surface of a folded portion in the flexible display, which is located at the boundary between the first housing and the second housing, may be visible to the naked eye. The visibility of the folded portion aesthetically unpleasing.

SUMMARY

According to certain embodiments of the disclosure, it is possible to provide an electronic device that protects glass from an external impact and avoid the visible bent surface of a folded portion in the flexible display.

According to certain embodiments, an electronic device comprises a first housing; a second housing; a hinge disposed between the first housing and the second housing such that the second housing is foldable at one end of the first housing; and a flexible display disposed on a surface of the first housing and a surface of the second housing, wherein the flexible display comprises a display panel, and a glass layer disposed on the display panel, such that the display panel is between the glass layer and the surface of the first housing and the surface of the second housing, wherein the glass layer comprises: a bendable portion configured to be flat in an unfolded state when the first housing and the second housing are disposed horizontally adjacent, and to be bent in a folded state when the first housing and the second housing are vertically adjacent; and a first flat portion adjacent to the bending portion to form a boundary and a second flat portion disposed to extend from the first flat portion to an edge of the glass layer, wherein the glass layer comprises a glass member, wherein the glass member has a first thickness in the second flat portion, has a second thickness at the center of the bending portion, and has a third thickness less than the first thickness and greater than the second thickness in a section between the first flat portion and the center of the bending portion, and wherein the thickness of the glass member gradually decreases from the first flat portion to the center of the bending portion forming a concave portion.

According to another embodiment, a glass layer for a flexible display of a foldable electronic device, the glass comprises: a bending portion configured to be bent in a folded state of the foldable electronic device; and a first flat portion adjacent to the bending portion to form a boundary and a second flat portion disposed to extend from the first flat portion to an edge of the glass layer, a glass member, wherein the glass member has a first thickness in the second flat portion, has a second thickness at the center of the bending portion, and has a third thickness less than the first thickness and greater than the second thickness in a section between the first flat portion and the center of the bending portion, and wherein the thickness of the glass member gradually decreases from the first flat portion to the center of the bending portion to form a concave portion.

The electronic device according to certain embodiments of the disclosure can protect glass from an external impact, and can prevent an observable bent surface of the flexible display at the boundary between the first housing and the second housing.

In addition to this, various effects that are directly or indirectly recognized through the disclosure may be provided.

DETAILED DESCRIPTION

Figure 1:
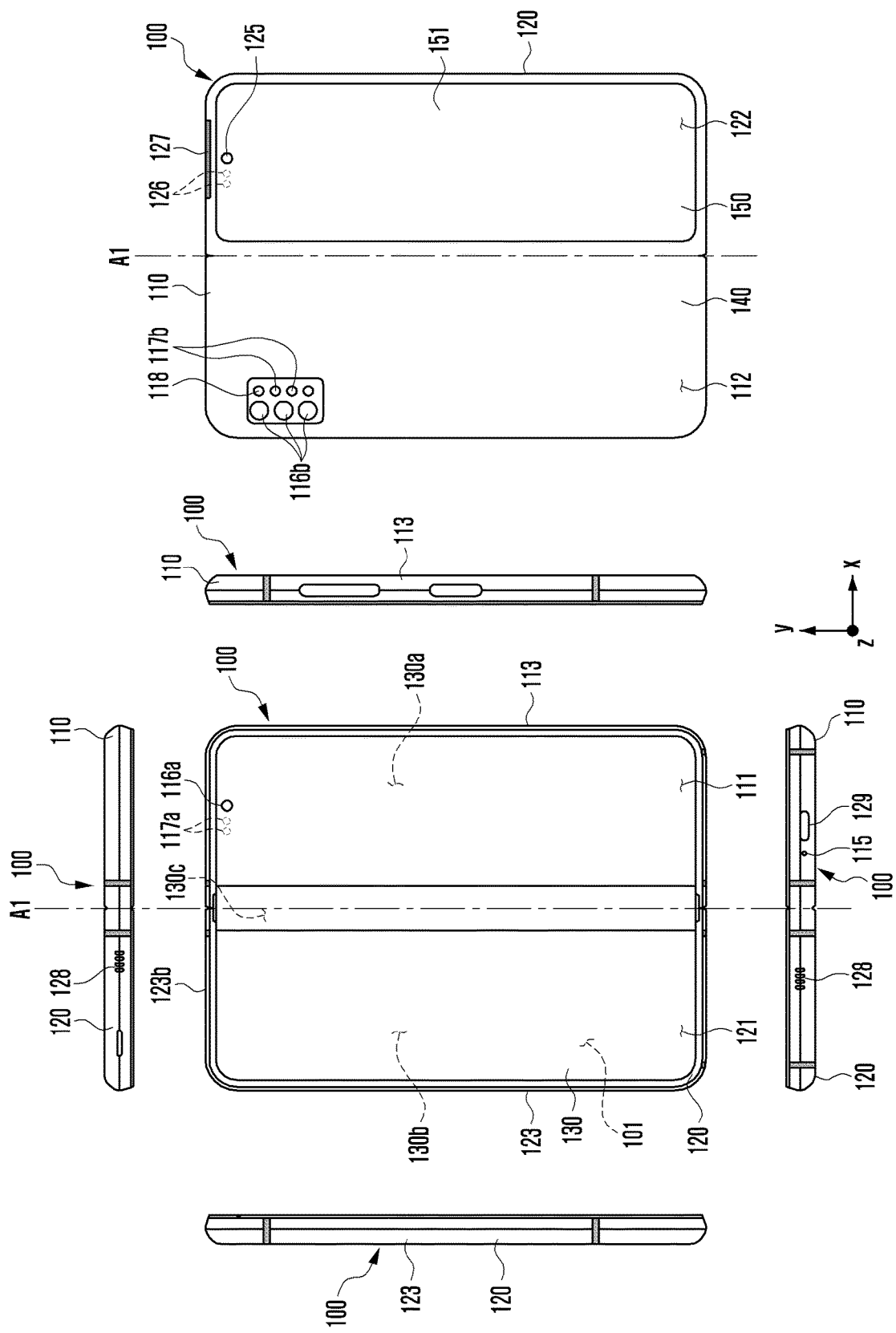
FIG. 1 is a diagram illustrating an unfolded state (unfolded stage) of an electronic device according to certain embodiments of the disclosure.
Figure 2:
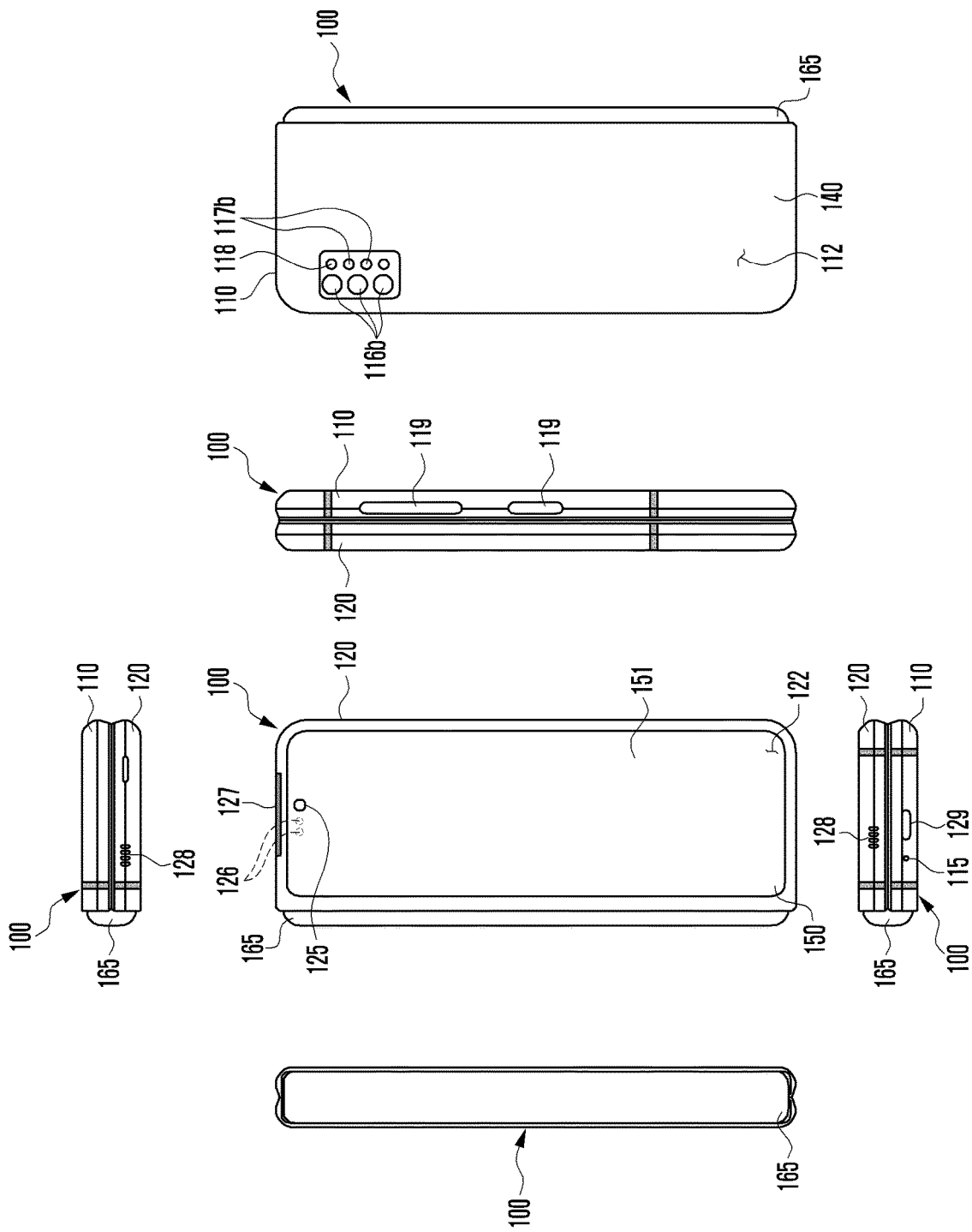
FIG. 2 is a diagram illustrating a folded state of the electronic device in FIG. 1 according to certain embodiments of the disclosure.

FIGS. 1 and 2 show the unfolded (FIG. 1) and folded state (FIG. 2) of an foldable electronic device 100. The foldable electronic device may include a hinge 164. The hinge movably couples a first and second housing 110, 120 to each other. The foldable electronic device may include a flexible display 130 disposed to cross the first housing and the second housing when the foldable electronic device is in an open state of 180 degrees.

A glass layer is disposed on the flexible display. The glass layer can include UTG (ultra-thin glass) so that the glass layer is bendable with the first and second housings 110, 120.

The electronic device according to certain embodiments of the disclosure can protect glass from an external impact, and can prevent an observable bent surface of the flexible display 130 at the boundary between the first housing 110 and the second housing 120.

FIG. 1 is a diagram illustrating an unfolded state (unfolded stage) of an electronic device 100 according to certain embodiments of the disclosure. In the unfolded state, the housings 110 and 120 are horizontally adjacent. FIG. 2 is a diagram illustrating a folded state of the electronic device 100 in FIG. 1 according to certain embodiments of the disclosure. In the folded state, the housings 110 and 120 are vertically adjacent.

Referring to FIGS. 1 and 2, the electronic device 100 may include a pair of housings 110 and 120 (e.g., a foldable housing). The pair of housings 110 and 120 are rotatably coupled based on a folding axis A1 by a hinge (e.g., the hinge 164 in FIG. 3). The housings 110 and 120 can be folded against each other. A first display 130 (e.g., a flexible display, a foldable display, or a main display) is disposed on the surface of the pair of housings 110 and 120, and a second display 151 (e.g., a sub-display).

The hinge (e.g., the hinge 164 in FIG. 3) may be disposed so as not to be visible when the electronic device is in a folded state. Hinge cover 165 that protects the hinge and covers the foldable area in the unfolded state. In the disclosure, the surface on which the first display 130 is disposed may be defined as a front surface of the electronic device 100, and the opposite surface of the front surface may be defined as a rear surface of the electronic device 100. In addition, the surface surrounding the space between the front surface and the rear surface may be defined as a side surface of the electronic device 100.

Figure 3:
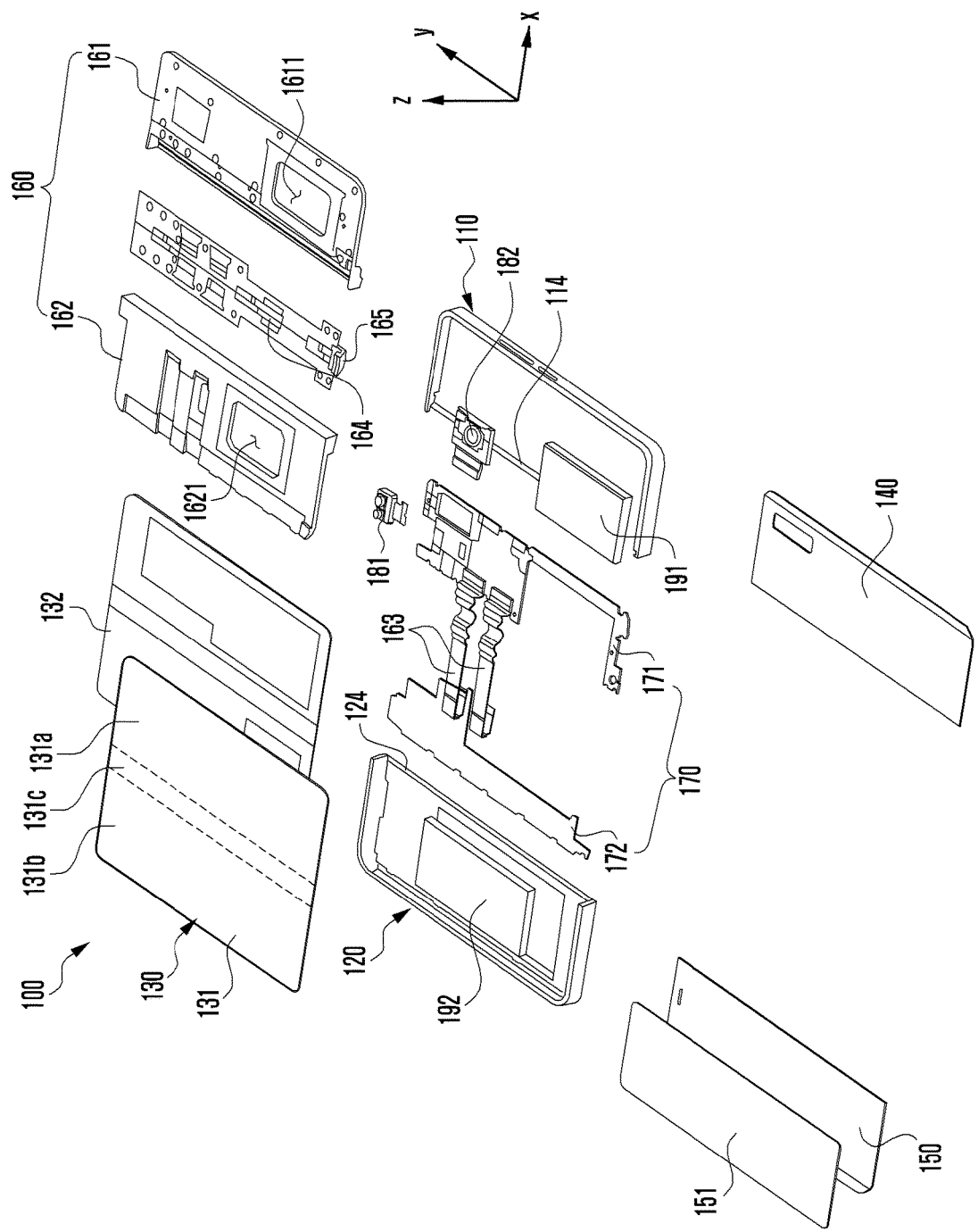
FIG. 3 is an exploded perspective view of an electronic device according to certain embodiments of the disclosure.

The housings 110 and 120 may include a first housing 110 and a second housing 120 that are foldable against each other through the hinge (e.g., the hinge 164 in FIG. 3). The pair of housings 110 and 120 are not limited to the form and coupling shown in FIGS. 1 and 2, and may be implemented by a combination and/or coupling of other shapes or components. The first housing 110 and the second housing 120 may be disposed on both sides of the folding axis A1, and may have an overall symmetrical shape with respect to the folding axis A1. According to some embodiments, the first housing 110 and the second housing 120 may be folded asymmetrically with respect to the folding axis A1. The angle or distance between the first housing 110 and the second housing 120 may vary depending on whether the electronic device 100 is in an unfolded stage, a folded state, or an intermediate state.

The first housing 110 may include a first surface 111 that is connected to the hinge (e.g., the hinge 164 in FIG. 3). The first surface 111 may be disposed to face the front surface of the electronic device 100 in the unfolded state of the electronic device 100. The first housing may include a second surface 112 facing the opposite direction of the first surface 111, and a first side member 113. The first side member 113 may surround at least a portion of a first space between the first surface 111 and the second surface 112.

The second housing 120 may include a third surface 121 that is connected to the hinge (e.g., the hinge 164 in FIG. 3). The third surface 121 can be disposed to face the front surface of the electronic device 100 in the unfolded state of the electronic device 100. The second housing 120 can also include a fourth surface 122 facing the opposite direction of the third surface 121, and a second side member 123. The side member can surround at least a portion of a second space between the third surface 121 and the fourth surface 122.

The first surface 111 may be directed in the same direction as the third surface 121 in the unfolded state, and face the third surface 121 in the folded state. The electronic device 100 may include a recess 101 that is formed to accommodate the first display 130 through the structural coupling of the first housing 110 and the second housing 120. The recess 101 may have substantially the same size as the first display 130.

The hinge cover 165 may be disposed between the first housing 110 and the second housing 120, thereby being disposed to be able to cover the hinge (e.g., the hinge 164 in FIG. 3). The hinge cover 165 may be covered by a portion of the first housing 110 and the second housing 120 or exposed depending on the state of the electronic device 100. For example, when the electronic device 100 is in the unfolded state, the hinge cover 165 may be covered by the first housing 110 and the second housing 120 so as not to be exposed. When the electronic device 100 is in the folded state, the hinge cover 165 may be exposed. In the case of the intermediate state in which the first housing 110 and the second housing 120 are folded with a certain angle, the hinge cover 165 may be at least partially exposed to the outside of the electronic device 100 between the first housing 110 and the second housing 120. For example, the area in which the hinge cover 165 is exposed to the outside may be smaller than that in the fully folded state. The hinge cover 165 may include a curved surface.

When the electronic device 100 is in the unfolded state (e.g., the state in FIG. 1), the first housing 110 and the second housing 120 may form an angle of 180 degrees ("180 degrees" shall be understood to include 180 degrees, substantially 180 degrees, or within 3 degrees of 180 degrees), and a first area 130a, a folding area 130c, and a second area 130b of the first display 130 may form the same plane, and may be disposed to be directed in the same direction. When the electronic device 100 is in the unfolded state, the first housing 110 may rotate at an angle of 360 degrees with respect to the second housing 120 to be reversely folded such that the second surface 112 and the fourth surface 122 face each other (an out-folding type).

When the electronic device 100 is in the folded state (e.g., the state in FIG. 2), the first surface 111 of the first housing 110 and the third surface 121 of the second housing 120 may be disposed to face each other. The first housing 110 and the second housing 120 are vertically adjacent or stacked. In this case, the first area 130a and the second area 130b of the first display 130 may form a narrow angle (e.g., in the range of 0 degrees to 10 degrees) through the folding area 130c, and may be disposed to face each other. At least a portion of the folding area 130c may be formed as a curved surface having a certain radius of curvature. When the electronic device 100 is in the intermediate state, the first housing 110 and the second housing 120 may be disposed at a certain angle. In this case, the first area 130a and the second area 130b of the first display 130 may form an angle greater than the folded state and less than the unfolded state, and the radius of curvature of the folding area 130c may be greater than that in the folded state. In some embodiments, the first housing 110 and the second housing 120 may form an angle to stop at a specified folding angle of between the folded state and the unfolded state through the hinge (e.g., the hinge 164 in FIG. 3) (a free stop function). In some embodiments, the first housing 110 and the second housing 120 may operate while being pressed in the direction to be unfolded or in the direction to be folded based on a specified inflection angle through the hinge (e.g., the hinge 164 in FIG. 3).

The electronic device 100 may include at least one of at least one display 130 or 151 disposed in or on a surface of the first housing 110 and/or the second housing 120. The electronic device 100 may also include an input device 115, sound output devices 127 and 128, sensor modules 117a, 117b, and 126, camera modules 116a, 116b, and 125, a key input device 119, an indicator (not shown), or a connector port 129. In some embodiments, the electronic device 100 may exclude at least one of the elements, or may further include at least one of other elements.

The at least one display 130 or 151 may include a first display 130 (e.g., a flexible display) disposed to be supported by the third surface 121 of the second housing 120 from the first surface 111 of the first housing 110 through the hinge (e.g., the hinge 164 in FIG. 3), and a second display 151 disposed to be visible to the outside through the fourth surface 122 in the inner space of the second housing 120. The first display 130 may be mainly used in the unfolded state of the electronic device 100, and the second display 151 may be mainly used in the folded state of the electronic device 100. According to an embodiment, in the intermediate state, the electronic device 100 may use the first display 130 or the second display 151, based on a folding angle of the first housing 110 and the second housing 120.

According to certain embodiments, the first display 130 may be disposed in a space formed by a pair of housings 110 and 120. For example, the first display 100 may be seated in a recess 101 formed by a pair of housings 110 and 120, and may be disposed to substantially occupy most of the front surface of the electronic device 100. The first display 130 may include a flexible display in which at least a portion thereof may be transformed into a flat or curved surface. The first display 130 may include a first area 130a facing the first housing 110, a second area 130b facing the second housing 120, and a folding area 130c that connects the first area 130a to second area 130b and faces the hinge (e.g., the hinge 164 in FIG. 3).

The first area 130a of the first display 130 may substantially form the first surface 111 of the first housing 110. The second area 130b of the first display 130 may substantially form the third surface 121 of the second housing 120.

The areas of the first display 130 are only exemplary physical divisions by a pair of housings 110 and 120 and the hinge (e.g., the hinge 164 in FIG. 3), and the first display 130 may be substantially displayed as a seamless full screen through a pair of housings 110 and 120 and the hinge (e.g., the hinge 164 in FIG. 3). The first area 130a and the second area 130b may have an overall symmetrical shape or a partially asymmetrical shape based on the folding area 130c.

According to certain embodiments, the electronic device 100 may include a first rear cover 140 disposed on the second surface 112 of the first housing 110 and a second rear cover 150 disposed on the fourth surface 122 of the second housing 120. In some embodiments, at least a portion of the first rear cover 140 may be integrally formed with the first side member 113. In some embodiments, at least a portion of the second rear cover 150 may be integrally formed with the second side member 123. According to an embodiment, at least one of the first rear cover 140 and the second rear cover 150 may be formed through a substantially transparent plate (e.g., a glass plate including various coating layers, or a polymer plate) or an opaque plate. The first rear cover 140 may, for example, be formed by an opaque plate such as coated or tinted glass, ceramic, polymer, metal (e.g., aluminium, stainless steel (STS), or magnesium), or a combination of at least two of the above materials. The second rear cover 150, for example, may be formed through a substantially transparent plate, such as, glass or polymer. Accordingly, the second display 151 may be disposed to be visible to the outside through the second rear cover 150 in the inner space of the second housing 120.

The input device 115 may include a microphone 115. In some embodiments, the input device 115 may include a plurality of microphones 115 disposed to be able to detect the direction of sound. The sound output devices 127 and 128 may include speakers 127 and 128. The speakers 127 and 128 may include a call receiver 127 disposed through the fourth surface 122 of the second housing 120 and an external speaker 128 disposed through the side member of the second housing 120. In some embodiments, the microphone 115, the speakers 127 and 128, and the connector 129 may be disposed in the spaces of the first housing 110 and/or the second housing 120, and may be in contact with the external environment through at least one hole formed in the first housing 110 and/or the second housing 120. In some embodiments, the holes formed in the first housing 110 and/or the second housing 120 may be used in common for the microphone 115 and the speakers 127 and 128. In some embodiments, the sound output devices 127 and 128 may include a speaker (e.g., a piezo speaker) that operates without the holes formed in the first housing 110 and/or the second housing 120.

The camera modules 116a, 116b, and 125 may include a first camera device 116a disposed on the first surface 111 of the first housing 110, a second camera device 116b disposed on the second surface 112 of the first housing 110, and/or a third camera device 125 disposed on the fourth surface 122 of the second housing 120. The electronic device 100 may include a flash 118 disposed near the second camera device 116b. The flash 118 may include, for example, a light-emitting diode or a xenon lamp. The camera devices 116a, 116b, and 125 may include one or more lenses, an image sensor, and/or an image signal processor. In some embodiments, at least one of the camera devices 116a, 116b, and 125 may include two or more lenses (wide-angle and telephoto lenses) and image sensors, and may be disposed together on either side of the first housing 110 and/or the second housing 120.

The sensor modules 117a, 117b, and 126 may produce an electrical signal or a data value corresponding to the internal operation state of the electronic device 100 or the external environmental state. The sensor modules 117a, 117b, and 126 may include a first sensor module 117a disposed on the first surface 111 of the first housing 110, a second sensor module 117b disposed on the second surface 112 of the first housing 110, and a third sensor module 126 disposed on the fourth surface 122 of the second housing 120. In some embodiments, the sensor modules 117a, 117b, and 126 may include at least one of a gesture sensor, a grip sensor, a color sensor, an infrared (IR) sensor, an illumination sensor, an ultrasonic sensor, an iris recognition sensor, or a distance detection sensor (a TOF sensor or a RiDAR scanner).

The electronic device 100 may further include at least one of non-illustrated sensor modules, for example, an atmospheric pressure sensor, a magnetic sensor, a biometric sensor, a temperature sensor, a humidity sensor, and a fingerprint recognition sensor. In some embodiments, the fingerprint recognition sensor may be disposed through at least one of the first side member 113 of the first housing 110 and/or the second side member 123 of the second housing 120.

The key input device 119 may be disposed to be exposed to the outside through the first side member 113 of the first housing 110. In some embodiments, the key input device 119 may be disposed to be exposed to the outside through the second side member 123 of the second housing 120. The electronic device 100 may exclude some or all of the key input devices 119 mentioned above, and the excluded key input device 119 may be implemented in another form such as a soft key in the at least one display 130 or 151 or the like. As another embodiment, the key input device 119 may be implemented using a pressure sensor included in the at least one display 130 or 151.

The connector port 129 may accommodate a connector (e.g., a USB connector or an IF module (interface connector port module)) for transmitting and receiving power and/or data to and from an external electronic device. In some embodiments, the connector port 129 may further perform a function of transmitting and receiving an audio signal to and from an external electronic device, or may further include a separate connector port (e.g., an ear jack hole) for performing a function of transmitting and the receiving an audio signal.

At least one camera device 116a or 125 among the camera devices 116a, 116b, and 125, at least one sensor module 117a or 126 among the sensor modules 117a, 117b, and 126, and/or the indicator may be disposed to be exposed through the at least one display 130 or 151. For example, at least one camera device 116a or 125, at least one sensor module 117a and 126, and/or the indicator may be disposed below an activation area (the display area) of the displays 130 and 140 in the inner space of the at least one housing 110 or 120, and may be disposed to be exposed to the external environment through an opening that is perforated to the cover member (e.g., a window layer (not shown) and/or the second rear cover 150 of the first display 130). In another embodiment, some camera devices or sensor modules 104 may be disposed to perform their own functions without being visually exposed through the display. For example, the area of the display 101 (e.g., the display panel) facing the camera device and/or the sensor module may not require the perforated opening.

FIG. 3 is an exploded perspective view of an electronic device 100 according to certain embodiments of the disclosure.

Referring to FIG. 3, the electronic device 100 may include a first display 130, a second display 151, a support member assembly 160, at least one printed circuit board 170, a first housing 110, a second housing 120, a first rear cover 140, and a second rear cover 150.

According to certain embodiments, the first display 130 may include a display panel 131 (e.g., a flexible display panel) and one or more plates 132 or layers on which the display panel 131 (e.g., the flexible display panel) is placed. According to an embodiment, one or more plates 132 may include a conductive plate (e.g., a Cu sheet or a SUS sheet) disposed between the display panel 131 and the support member assembly 160. According to an embodiment, one or more plates 132 may be formed to have substantially the same area as the first display 130, and the area facing the folding area 130c of the first display 130c may be formed to be bendable. According to an embodiment, one or more plates 132 may include at least one sub-material layer (e.g., a graphite member) disposed on the rear surface of the display panel 131. According to an embodiment, one or more plates 132 may be formed in a shape corresponding to the display panel 131.

According to certain embodiments, the second display 151 may be disposed in the space between the second housing 120 and the second rear cover 150. The second display 151 may be disposed to be visible to the outside through substantially the entire area of the second rear cover 150 in the space between the second housing 120 and the second rear cover 150.

According to certain embodiments, the support member assembly 160 may include a first support member 161 (e.g., a first support plate), a second support member 162 (e.g., a second support plate), a hinge 164 disposed between the first support member 161 and the second support member 162, a hinge cover 165 that covers the hinge 164 when viewed from the outside, and at least one wiring member 163 (e.g., a flexible printed circuit board (FPCB)) crossing the first support member 161 and the second support member 162. The support member assembly 160 may be disposed between one or more plates 132 and at least one printed circuit board 170. The first support member 161 may be disposed between the first area 131a of the first display 130 and the first printed circuit board 171. The second support member 162 may be disposed between the second area 131b of the first display 130 and the second printed circuit board 172. According to an embodiment, at least one wiring member 163 and at least a portion of the hinge 164 may be disposed inside the support member assembly 160. At least one wiring member 163 may be disposed in the direction (e.g., the x-axis direction) crossing the first support member 161 and the second support member 162. According to an embodiment, at least one wiring member 163 may be disposed in the direction (e.g., the x-axis direction) perpendicular to the folding axis (e.g., the y-axis or the folding axis A in FIG. 1) of the folding area 130c.

According to certain embodiments, at least one printed circuit board 170 may include a first printed circuit board 171 disposed to face the first support member 161 and a second printed circuit board 172 disposed to face the second support member 162. The first printed circuit board 171 and the second printed circuit board 172 may be disposed in the inner space formed by the support member assembly 160, the first housing 110, the second housing 120, the first rear cover 140, and/or the second rear cover 150. The first printed circuit board 171 and the second printed circuit board 172 may include a plurality of electronic components disposed to implement various functions of the electronic device 100.

According to certain embodiments, the electronic device may include, in the first space of the first housing 110, a first printed circuit board 171 disposed in the space formed through the first support member 161, a first battery 191 disposed in the position facing a first swelling hole 1611 of the first support member 161, at least one camera device 182 (e.g., the first camera device 116a and/or the second camera device 116b in FIG. 1), or at least one sensor module 181 (e.g., the first sensor module 117a and/or the second sensor module 117b in FIG. 1). According to an embodiment, a second printing circuit board 172 disposed in a second space formed through the second support member 162 and a second battery 192 disposed in the position facing a second swelling hole 1621 of the second support member 162 may be included in a second space of the second housing 120. The first housing 110 and the first support member 161 may be integrally formed. The second housing 120 and the second support member 162 may also be integrally formed.

According to certain embodiments, the first housing 110 may include a first rotation support surface 114, and the second housing 120 may include a second rotation support surface 124 corresponding to the first rotation support surface 114. The first rotation support surface 114 and the second rotation support surface 124 may include a curved surface corresponding to (naturally connected to) the curved surface included in the hinge cover 165. According to an embodiment, when the electronic device 100 is in the unfolded state, the first rotation support surface 114 and the second rotation support surface 124 may cover the hinge cover 165 such that the hinge cover 165 is not exposed or is minimally exposed through the rear surface of the electronic device 100. According to an embodiment, when the electronic device 100 is in the folded state, the first rotation support surface 114 and the second rotation support surface 124 may rotate along the curved surface included in the hinge cover 165, thereby maximally exposing the hinge cover 165 through the rear surface of the electronic device 100.

Figure 4A:
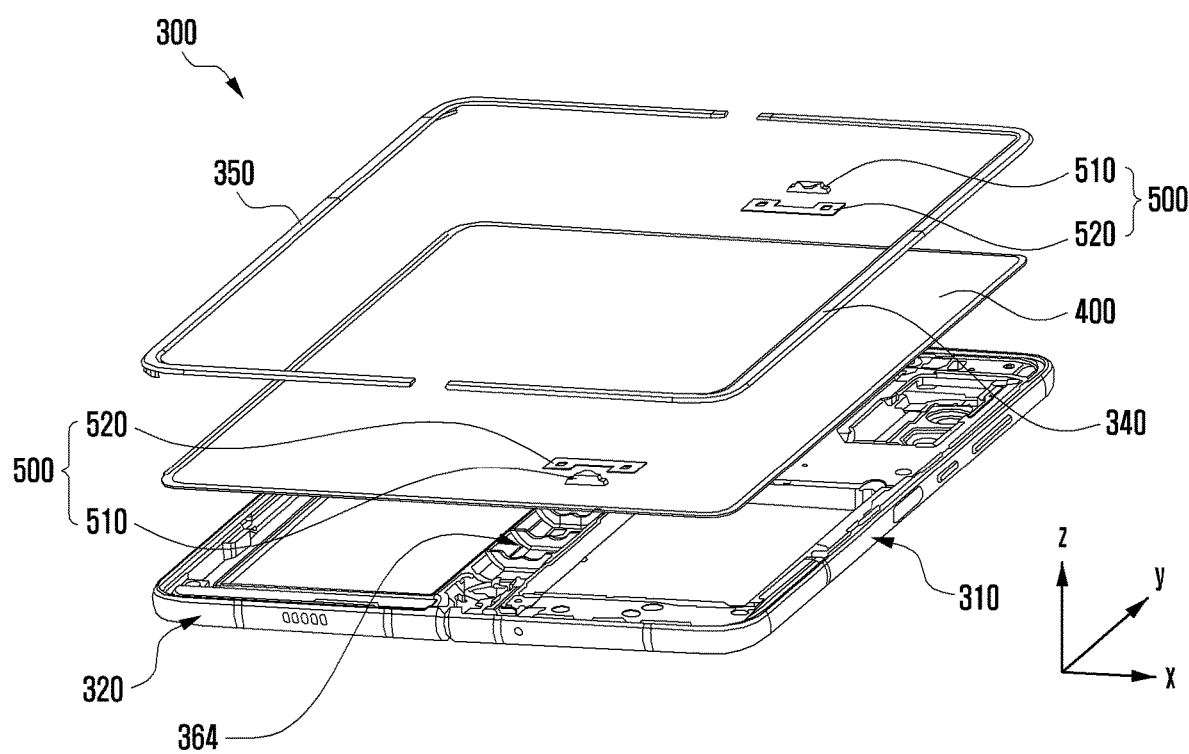
FIG. 4A is an exploded perspective view of an electronic device including a flexible display according to certain embodiments of the disclosure.

FIG. 4A discloses the front surface of the electronic device 300 when the electronic device 300 is in the open state. The electronic device 300 includes a first housing 310 and a second housing 320. A hinge 364 allows the first housing 310 and the second housing 320 to fold about axis A1.

A flexible display 400 is disposed on the surface of the first housing 310 and the second housing 320. When the electronic device 300 folds, the flexible display 400 deforms.

Figure 5:
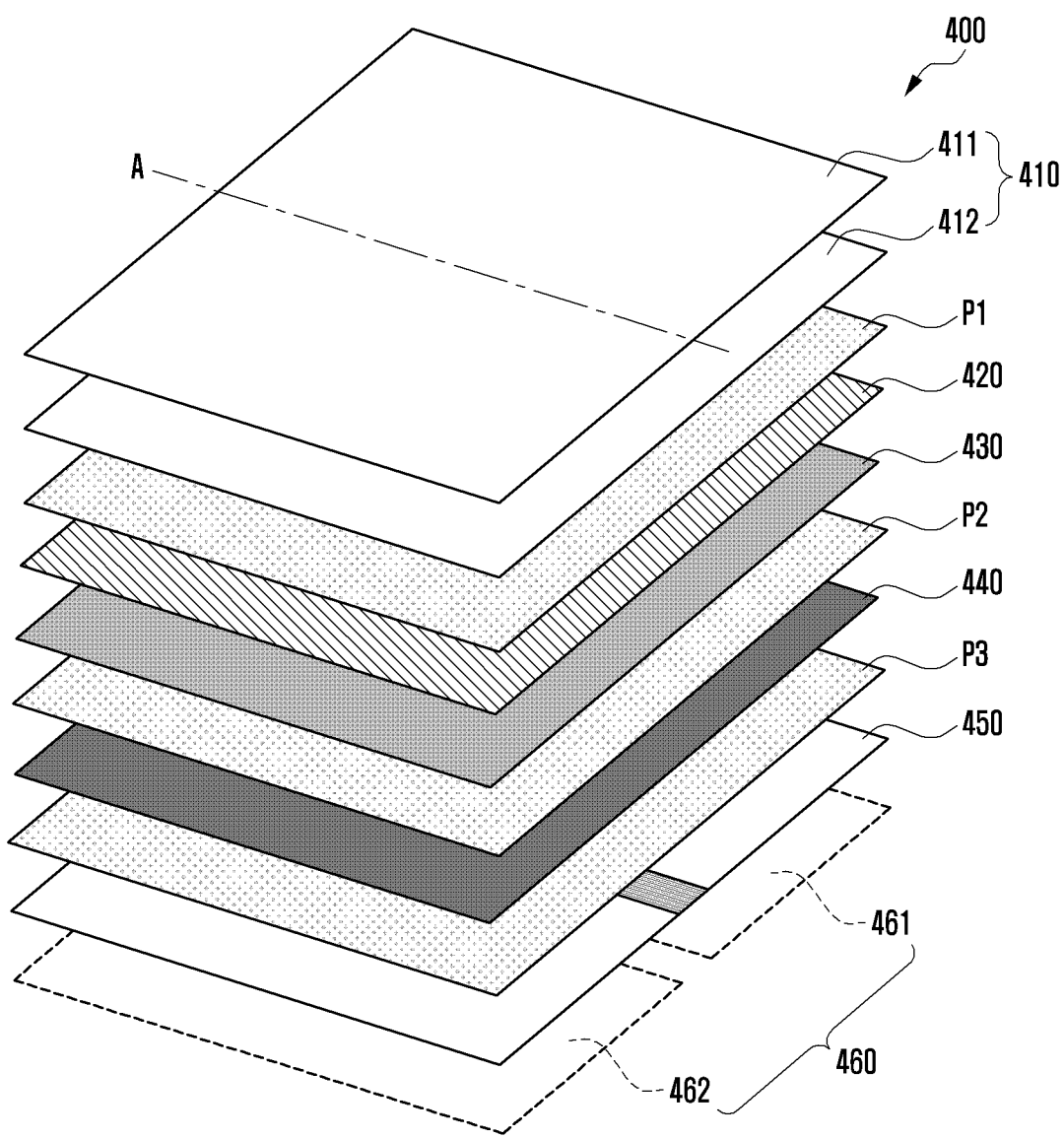
FIG. 5 is a perspective view illustrating a stacked structure of a flexible display according to certain embodiments of the disclosure.

FIG. 5 discloses the flexible display 400. The flexible display 400 includes a window layer 410 disposed above a display layer 430. The window layer 410 includes a polymer layer 411 disposed above a glass layer 412.

Figure 4B:
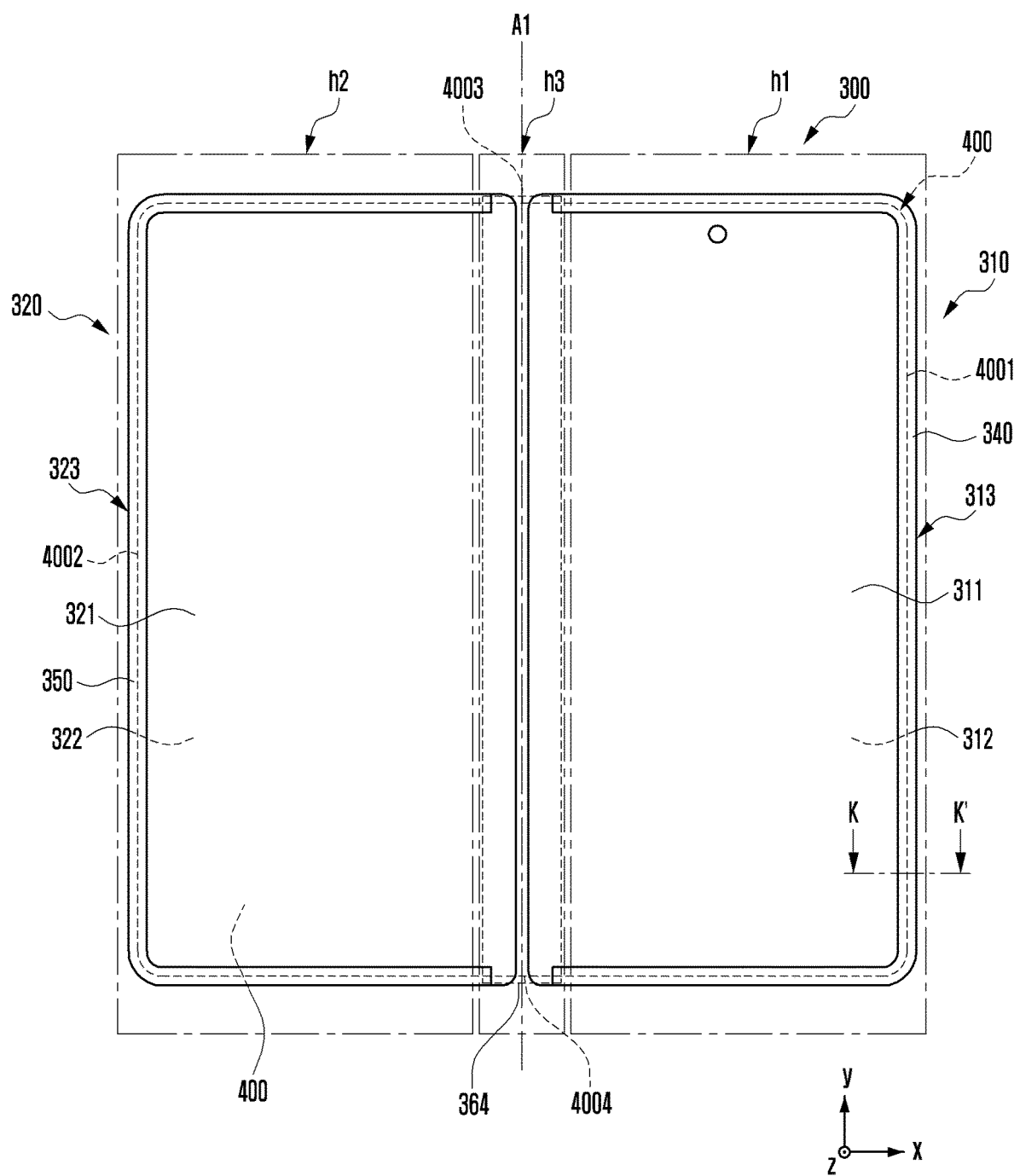
FIG. 4B is a diagram illustrating configuration for each area of an electronic device according to certain embodiments of the disclosure.

FIG. 4A is an exploded perspective view of an electronic device 300 including a flexible display 400 according to certain embodiments of the disclosure. FIG. 4B is a diagram illustrating configuration for each area of an electronic device 300 according to certain embodiments of the disclosure.

The electronic device 300 in FIGS. 4A and 4B may be at least partially similar to the electronic device 100 in FIG. 1, or may further include other embodiments of the electronic device.

Referring to FIGS. 4A and 4B, the electronic device 300 (e.g., the electronic device 100 in FIG. 1) may include a first housing 310 (e.g., the first housing 110 in FIG. 1) (e.g., a first housing structure) that includes a first surface 311 (e.g., the first surface 111 in FIG. 1), a second surface 312 (e.g., the second surface 112 in FIG. 1) directed in the opposite direction of the first surface 311, and a first side member 313 (e.g., the first side member 113 in FIG. 1) surrounding a first space between the first surface 311 and the second surface 312. The electronic device 300 may include a second housing 320 (e.g., the second housing 120 in FIG. 1) (e.g., a second housing structure) that includes a third surface 321 (e.g., the third surface 121 in FIG. 1) directed in the same direction as the first surface 311 in the unfolded state, a fourth surface 322 (e.g., the fourth surface 122 in FIG. 1) directed in the same direction as the second surface 312, and a second side member 323 (e.g., the second side member 123 in FIG. 1) surrounding a second space between the third surface 321 and the fourth surface 322. The first housing 310 and the second housing 320 may be installed to be foldable with respect to each other around the folding axis A1 through the hinge 364 (e.g., the hinge 164 in FIG. 3). For example, the electronic device 300 may maintain the folded or unfolded state by rotating the first housing 310 and the second housing 320 with respect to each other through the hinge 364. The first surface 311 and the third surface 321 may face each other in the folded state of the electronic device 300, and the first surface 311 and the third surface 321 may be directed in the same direction in the unfolded state thereof. According to some embodiments, the first surface 311 and the third surface 321 may be directed in the opposite directions in the folded state of the electronic device 300, and the first surface 311 and the third surface 321 may be directed in the same direction in the unfolded state thereof. The electronic device 300 may include a flexible display 400 (e.g., the first display 130 in FIG. 1) disposed to at least partially cross the first surface 311 and the third surface 321. The flexible display 400 may be disposed to be supported by at least a portion of the first housing 310, the hinge 364, and the second housing 320.

The electronic device 300 (e.g., the electronic device 100 in FIG. 1) may include a first area h1 facing the first housing 310, a second area h2 facing the second housing 320, and a folding area h3 facing the hinge 364. The electronic device 300 may operate such that the first housing 310 corresponding to the first area h1 may be folded or unfolded with respect to the second housing 320 corresponding to the second area h2 through the hinge 364 corresponding to the folding area h3.

According to certain embodiments, the electronic device 300 may include at least one protecting frame 340 or 350 (e.g., a decorative member or a decor) disposed on top of the flexible display 400. According to an embodiment, at least one protecting frame 340 or 350 may include a first protecting frame 340 disposed on top of the flexible display 400 in the first area h1 and a second protecting frame 350 disposed on top of the flexible display 400 in the second area h2. The protecting frames 340 and 350 may be formed of a polymer material or a metal material, and may be disposed in the respective housings 310 and 320 through at least one of bonding, taping, fusion, or structural coupling.

The flexible display 400 may include a first edge 4001 facing at least a portion of the first housing 310, a second edge 4002 facing at least a portion of the second housing 320, a third edge 4003 that connects one end of the first edge 4001 and one end of the second edge 4002, and a fourth edge 4004 that connects the opposite end of the first edge 4001 and the opposite end of the second edge 4002. The first edge 4001 of the flexible display 400 and at least a portion of the third edge 4003 and fourth edge 4004 may be disposed between the first housing 310 and the first protecting frame 340 so as not to be visible to the outside. The second edge 4002 of the flexible display 400 and at least a portion of the third edge 4003 and fourth edge 4004 may be disposed between the second housing 320 and the second protecting frame 350 so as not to be visible to the outside.

Static electricity may be introduced into the electronic device 300 through the gaps between the flexible display 400 and the first protecting frame 340 and/or between the flexible display 400 and the second protecting frame 350. The introduced static electricity may be guided to at least one conductive structure electrically connected to the main ground of the electronic device 300 through a static electricity guide structure according to the exemplary embodiments of the disclosure, thereby preventing malfunction and damage of the display panel (e.g., the display panel 430 in FIG. 5).

The pair of protecting frames 340 and 350 may be omitted from the folding area h3 corresponding to the hinge 364 for the folding and unfolding operation of the first housing 310 and the second housing 320 around the hinge 364. The electronic device 300 may include a protecting structure 500 disposed in order to protect at least a portion of the third edge 4003 and at least a portion of the fourth edge 4004 of the flexible display exposed to the outside in the folding area h3. The edges of the flexible display 400 exposed through the folding area h3 may be disposed to be at least partially invisible to the outside through the protecting structure 500. The protecting structure 500 may include a support body 510 disposed to be supported by at least a portion of the hinge 364 and a blocking member 520 disposed to be supported by the support body 510 and to at least partially hide the edges of the flexible display 400 from the outside. In some embodiments, the support body 510 may include wing structures rotatably installed on the left and right sides of the support body 510 in order to support the film type blocking member 520.

Figure 6:
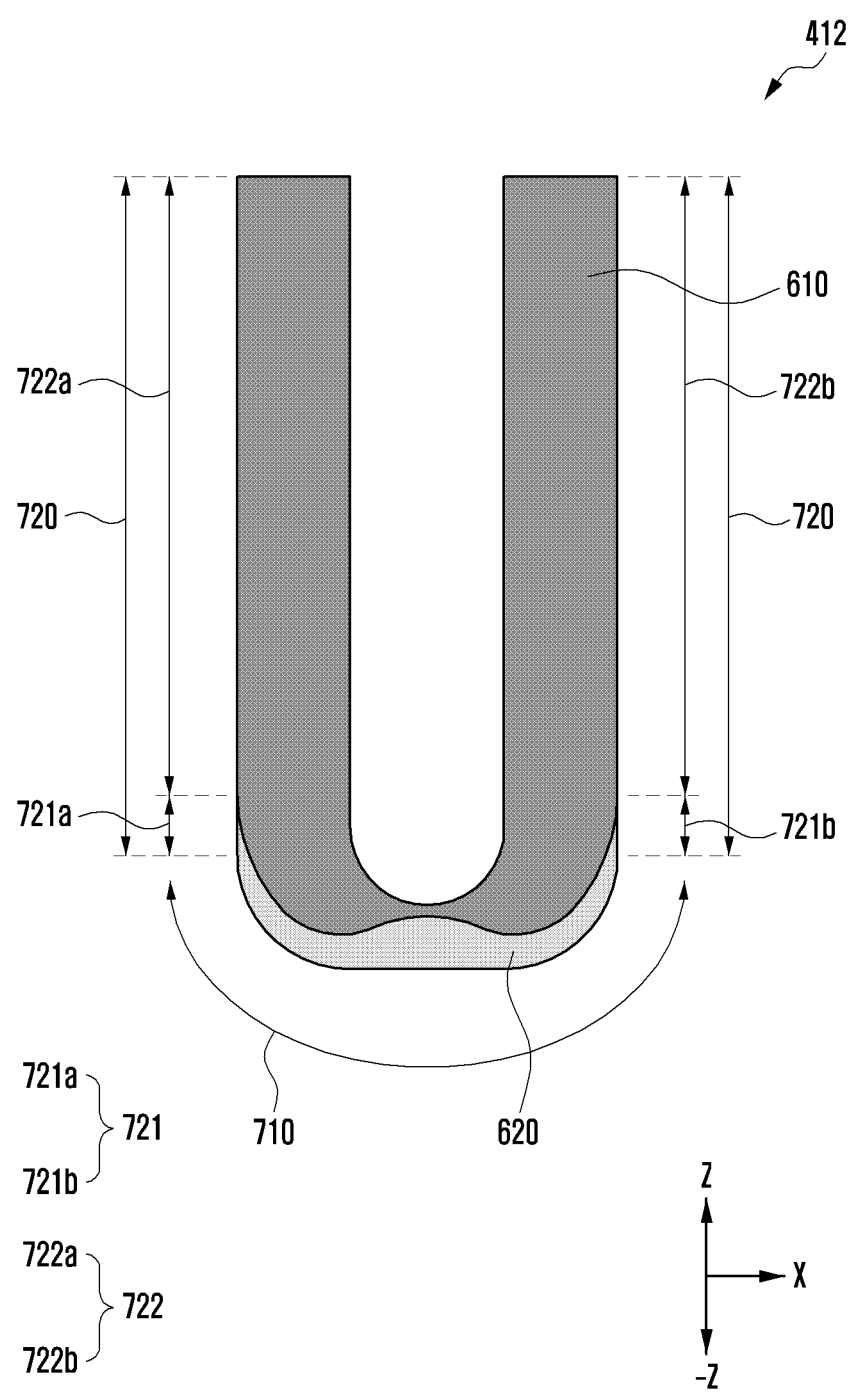
FIG. 6 is a cross-sectional view schematically illustrating a glass layer when an electronic device is in a folded state according to an embodiment.
Figure 7:
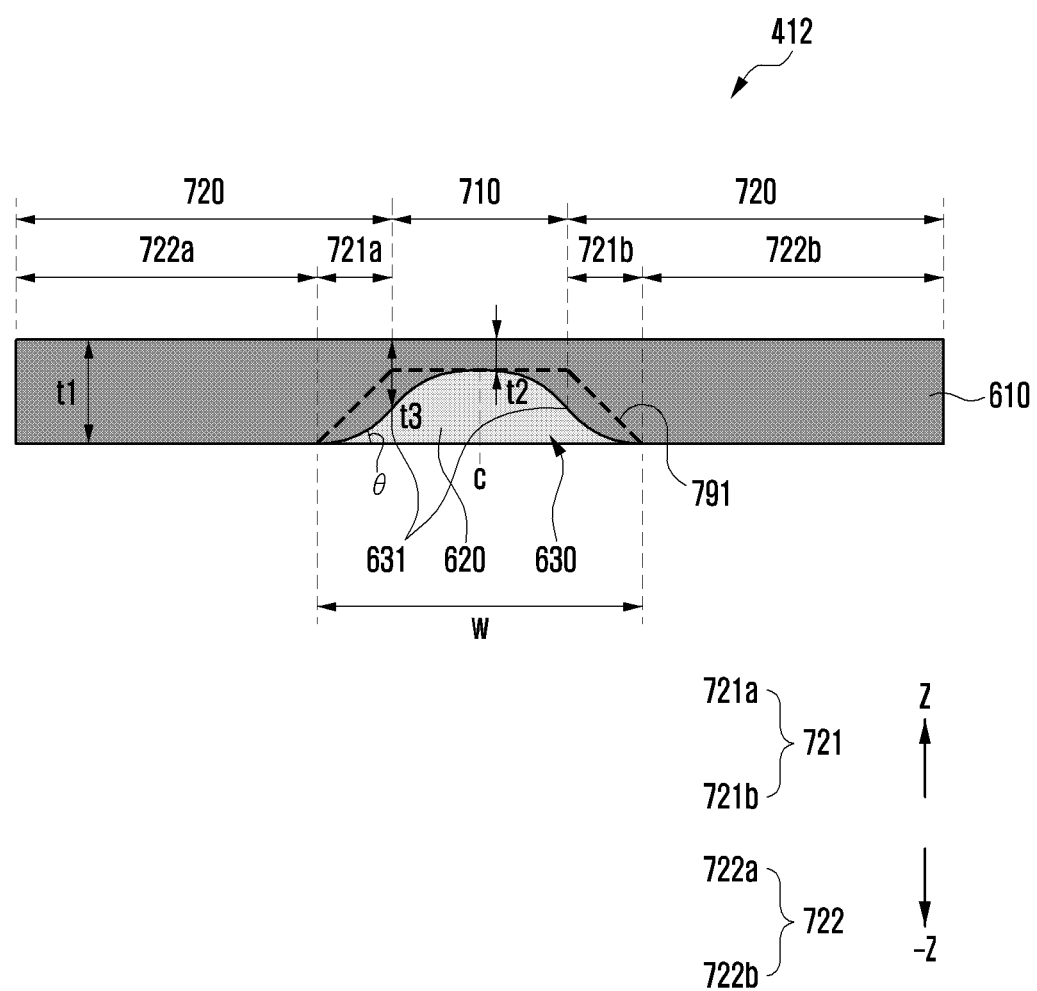
FIG. 7 is a cross-sectional view schematically illustrating a glass layer when an electronic device is in an unfolded state according to an embodiment.

An electronic device (e.g., the electronic device 100 in FIG. 1) according to certain embodiments of the disclosure may include a first housing (e.g., the first housing 310 in FIG. 4A), a second housing (e.g., the second housing 320 in FIG. 4A), a hinge (e.g., the hinge 164 in FIG. 3) disposed between the first housing 310 and the second housing 320 such that the second housing 320 is foldable from one end of the first housing 310, and a flexible display supported by the first housing 310 and the second housing 320, and including a display panel (e.g., the display panel 430 in FIG. 5) and a glass layer (e.g., the glass layer 412 in FIG. 5) disposed in a first direction from the display panel 430, wherein the glass layer 412 may include a bending portion (e.g., the bending portion 710 in FIG. 6) configured to be flat in an unfolded state in which the first housing 310 and the second housing 320 are disposed in a straight line side by side, and be bent in a folded state in which the first housing 310 and the second housing 320 face each other, and flat portions (e.g., the flat portions 720 in FIG. 6) configured to be flat in the unfolded state and the folded state, and including a first flat portion (e.g., the first flat portion 721 in FIG. 7) adjacent to the bending portion 710 to form a boundary and a second flat portion (e.g., the second flat portion 722 in FIG. 7) disposed to extend from the first flat portion 721 to an edge of the glass layer 412, wherein the glass layer 412 may include a glass member (e.g., the glass member 610 in FIG. 6), wherein the glass member 610 may have a first thickness in the second flat portion 722, have a second thickness at the center of the bending portion 710, and have a third thickness less than the first thickness and greater than the second thickness in a section between the first flat portion 721 and the center of the bending portion 710, and wherein the thickness of the glass member 610 gradually decreases from the first flat portion 721 to the center of the bending portion 710 to form a concave portion (e.g., the concave portion 630 in FIG. 7).

The glass member 610 may include UTG (ultra-thin glass), and the width of the concave portion 630 may be greater than the width of the bending portion 710.

According to an embodiment, an inclined surface may be formed on the surface of the concave portion 630, and when the angle of the inclined surface with respect to the surface of the second flat portion 722 is defined as θ, tan θ, which is the slope of the inclined surface, may be less than or equal to 1/10.

The first thickness may be double the second thickness or more.

The concave portion 630 may be formed in the first direction from the glass layer 412.

The concave portion 630 may be formed in a second direction opposite the first direction from the glass layer 412.

According to an embodiment, regular irregularities may be formed on the inclined surface of the concave portion 630.

According to an embodiment, irregular irregularities may be formed on the inclined surface of the concave portion 630.

The flexible display may further include a polarization layer disposed between the display panel 430 and the glass layer 412, a shock absorption layer disposed between the polarization layer and the glass layer 412, and a polymer layer disposed in the first direction from the glass layer 412, wherein the area of a first adhesive disposed between the glass layer 412 and the polymer layer may be greater than or equal to the area of the glass layer 412, and wherein the area of a second adhesive disposed between the glass layer 412 and the shock absorption layer may be greater than or equal to the area of the glass layer 412.

The area of the first adhesive disposed between the glass layer 412 and the polymer layer may be greater than the area of the glass layer 412, the area of the second adhesive disposed between the glass layer 412 and the shock absorption layer may be equal to the area of the glass layer 412, and, at at least one edge of the flexible display, the end of the first adhesive may protrude from the end of the glass layer 412 in a third direction perpendicular to the first direction, and the end of the second adhesive and the end of the glass layer 412 may be disposed to form a straight line.

The area of the first adhesive disposed between the glass layer 412 and the polymer layer may be greater than the area of the glass layer 412, and the area of the second adhesive disposed between the glass layer 412 and the shock absorption layer may be greater than the area of the glass layer 412, and at at least one edge of the flexible display, the end of the first adhesive may protrude from the end of the glass layer 412 in a third direction perpendicular to the first direction and the end of the second adhesive may protrude in the third direction from the end of the glass layer 412.

The area of the first adhesive disposed between the glass layer 412 and the polymer layer may be the same as the area of the glass layer 412, and the area of the second adhesive disposed between the glass layer 412 and the shock absorption layer may be greater than the area of the glass layer 412, and at at least one edge of the flexible display, an end of the first adhesive and an end of the glass layer 412 may be disposed to form a straight line and an end of the second adhesive may protrude from the end of the glass layer 412 in a third direction perpendicular to the first direction.

According to an embodiment, an adhesive member may be formed in the third direction from the end of the glass layer 412 so as to correspond between the first adhesive and the shock absorption layer.

The area of the shock absorption layer may be greater than the area of the display panel 430, and the area of a third adhesive disposed between the shock absorption layer and the display panel 430 may be greater than the area of the display, and at at least one edge of the flexible display, an end of the shock absorption layer and an end of the third adhesive may protrude from an end of the display panel 430 in a third direction perpendicular to the first direction.

The high-temperature adhesion of the third adhesive may be less than the high-temperature adhesion of each of the first adhesive and the second adhesive.

The third adhesive may include a photoinitiator component to react to UV (ultraviolet ray) light or laser in a specified wavelength band, thereby lowering the adhesion.

The thickness of the second adhesive may be less than the thickness of the first adhesive.

Glass for a flexible display of a foldable electronic device 100 according to certain embodiments of the disclosure may include a bending portion 710 configured to be bent in a folded state of the foldable electronic device 100, and flat portions 720 configured to be flat in an unfolded state and the folded state of the foldable electronic device 100, and including a first flat portion 721 adjacent to the bending portion 710 to form a boundary and a second flat portion 722 disposed to extend from the first flat portion 721 to an edge of the glass, wherein the glass may include a glass member 610, wherein the glass member 610 may have a first thickness in the second flat portion 722, have a second thickness at the center of the bending portion 710, and has a third thickness less than the first thickness and greater than the second thickness in a section between the first flat portion 721 and the center of the bending portion 710, and wherein the thickness of the glass member 610 may gradually decrease from the first flat portion 721 to the center of the bending portion 710 to form a concave portion 630.

The glass member 610 may include UTG (ultra-thin glass), and the width of the concave portion 630 may be greater than the width of the bending portion 710.

According to an embodiment, an inclined surface may be formed on the surface of the concave portion 630, and when the angle of the inclined surface with respect to the surface of the second flat portion 722 is defined as θ, tan θ, which is the slope of the inclined surface, is less than or equal to 1/10.

FIG. 5 is a perspective view illustrating a stacked structure of a flexible display 400 according to certain embodiments of the disclosure.

The flexible display 400 according to exemplary embodiments of the disclosure may include a UB (unbreakable) type OLED display (e.g., a curved display). The flexible display 400 according to exemplary embodiments of the disclosure may include a Y-OCTA (YOUM-on cell touch AMOLED (active matrix organic light-emitting diode)) type display.

The flexible display 400 in FIG. 5 may be at least partially similar to the first display 130 in FIG. 1, or may further include other embodiments.

Referring to FIG. 5, the flexible display 400 (e.g., the first display 130 in FIG. 1) may include a window layer 410, a polarization layer (POL (polarizer)) 420 (e.g., a polarizing film) sequentially disposed on the rear surface of the window layer 410, a display panel 430, a polymer member 440, and a conductive plate 450. The window layer 410 may include a polymer layer 411 (e.g., PET (polyethylene terephthalate)) and a glass layer 412 (e.g., UTG (ultra-thin glass)) laminated with the polymer layer 411. The polymer layer may include PET or polyimide. The glass layer may include UTG (ultra-thin glass). The polymer layer 411 may protect other layers (e.g., the glass layer 412, the polarization layer 420, and the display panel 430) included in the flexible display 400 from an external impact. For example, the polymer layer 411 may protect the glass layer 412 and prevent shattering when cracks occur in the glass layer 412. The polymer layer 411 may include a glass material or include a film layer or a coating layer. The polymer layer 411 may include a flexible material. The polymer layer 411 may be formed of a transparent material having high light-transmittance.

The flexible display 400 may include a color filter (not shown) in place of the polarization layer 420. For example, the color filter may perform the same or similar role as the polarization layer 420. For example, the electronic device 100 that does not include a color filter may be defined as a COE (color filter on encapsulation) type electronic device 100. The color filter may execute the function of the polarization layer 420 or play the role thereof in the COE type electronic device 100, thereby improving transmittance and reducing the thickness of the flexible display 400 by about 100 μm to about 150 μm.

The flexible display 400 may further include a touch panel that is not shown. The touch panel may be formed between the polarization layer 420 and the glass layer 412. In another embodiment, the touch panel may be formed between the display panel 430 and the polarization layer 420.

The window layer 410, the polarization layer 420, the display panel 430, the polymer member 440, and the conductive plate 450 may be disposed to cross at least a portion of a first surface (e.g., the first surface 111 in FIG. 1) of a first housing (e.g., the first housing 110 in FIG. 1) and a third surface (e.g., the third surface 121 in FIG. 1) of a second housing (e.g., the second housing 120 in FIG. 1). The window layer 410, the polarization layer 420, the display panel 430, the polymer member 440, and the conductive plate 450 may be attached to each other through adhesives P1, P2, and P3. For example, the adhesives P1, P2, and P3 may include at least one of an OCA (optical clear adhesive), a PSA (pressure sensitive adhesive), a heat-responsive adhesive, a general adhesive, and a double-sided tape. The flexible display 400 may include another adhesive member (e.g., a double-sided tape or a waterproof member) that is at least partially disposed on one surface of the conductive plate 450. The flexible display 400 may be attached to a support member assembly (e.g., the support member assembly 160 in FIG. 3) of the electronic device (e.g., the electronic device 100 in FIG. 3) through another adhesive member.

A dark color (e.g., black) may be applied to the polymer member 440 to help display the background when the display is turned off. The polymer member 440 may include a cushion for absorbing an impact from the outside of the electronic device, thereby preventing the flexible display 400 from being damaged. In some embodiments, in order to waterproof the flexible display 400, the polymer member 440 may be removed or disposed under the conductive plate 450.

The conductive plate 450 may be used to help reinforce rigidity of the electronic device, shield ambient noise, and dissipate heat emitted from surrounding heat emission components. The conductive plate 450 may include at least one of SUS (steel use stainless) (e.g., STS (stainless steel)), Cu, Al, or CLAD (e.g., a stacked member in which SUS and Al are alternately disposed). In another embodiment, the conductive plate 450 may include other alloy materials. According to an embodiment, a portion facing the first housing (e.g., the first housing 310 in FIG. 4A) of the electronic device (e.g., the electronic device 300 in FIG. 4A) and a portion facing the second housing (e.g., the second housing 320 in FIG. 4A) thereof may be connected to a bendable portion (e.g., a portion provided with bendability through a lattice structure including a plurality of openings and/or slits), which is formed at the portion facing the hinge (e.g., the hinge 364 in FIG. 4A), so that the conductive plate 450 may be integrally formed. In another embodiment, in the conductive plate 450, a portion facing the first housing (e.g., the first housing 310 in FIG. 4A) and a portion facing the second housing (e.g., the second housing 320 in FIG. 4A), excluding a portion facing the hinge (e.g., the hinge 364 in FIG. 4A), may be formed separately from each other. According to certain embodiments, the flexible display 400 may further include reinforcement plates 460 made of a metal material and disposed under the conductive plate for reinforcement of rigidity. The reinforcement plates 460 may include a first reinforcement plate 461 facing the first housing (e.g., the first housing 310 in FIG. 4A) and a second reinforcement plate 462 facing the second housing (e.g., the second housing 320 in FIG. 4A).

The flexible display 400 may include at least one functional member disposed between the polymer member 440 and the conductive plate 450. The functional member may include a graphite sheet for heat dissipation, a force touch FPCB, a fingerprint sensor FPCB, an antenna radiator for communication, a heat dissipation sheet, conductive/non-conductive tapes, or an open cell sponge. The functional member, when it is bendable, may be disposed from the first housing (e.g., the first housing 310 in FIG. 4A) to at least a portion of the second housing (e.g., the second housing 320 in FIG. 4A) through the hinge (e.g., the hinge 364 in FIG. 4A). In another embodiment, the flexible display 400 may further include a detection member for detecting an input by an electromagnetic induction type writing member. The detection member may include a digitizer.

The stacked structure and stacked order of the flexible display 400 shown in FIG. 5 may be variously modified. For example, at least some layers may be further inserted into the stacked structure or stacked order of the flexible display 400 shown in FIG. 5, or at least some layers may be omitted therefrom.

Figure 8:
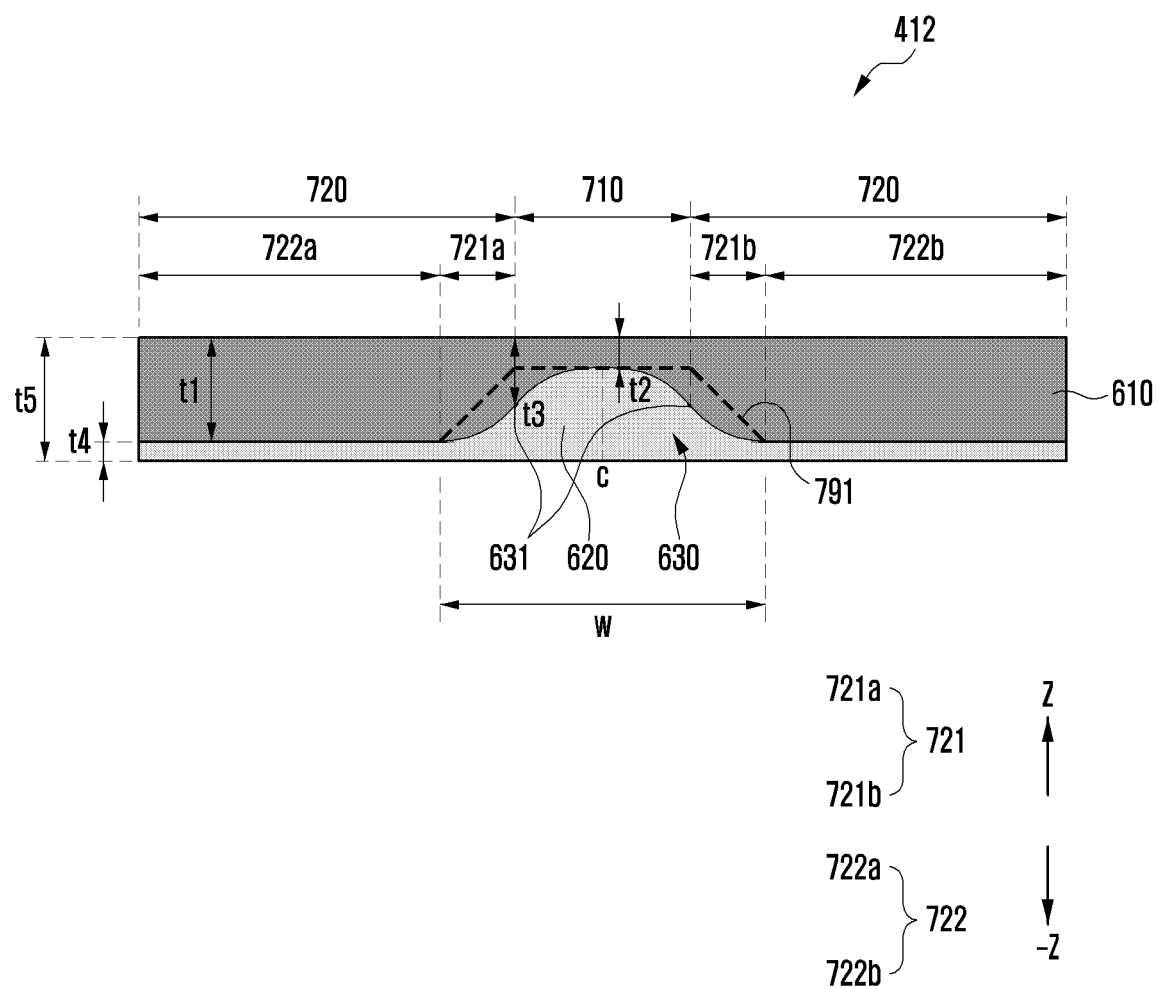
FIG. 8 is a cross-sectional view schematically illustrating a glass layer according to another embodiment.

FIGS. 6 and 7 illustrate the glass layer 412 when the electronic device is in the folded state (FIG. 6) and the unfolded state (FIG. 7). The glass layer 412 includes flat portions 720 and a bending portion 710. In the unfolded state, bending portion 710, the glass member 610 of the glass layer 412 is concave with a thickness t2 at the center. The thickness of the glass member 610 widens (e.g., t3) moving from the center towards the flat portions 720. Filling member 620 corresponds to the shape of the glass member 610, such that the bottom surface of the electronic device is flat. In FIG. 8, the glass layer 610 has a width of t1 at the edge of the electronic device when the electronic device is in the unfolded state. However, glass layer has a width of t5. The difference between width t1 and width t5 is a t4 thick layer of the filling member.

FIG. 6 is a cross-sectional view schematically illustrating a glass layer 412 when an electronic device 100 is in a folded state according to an embodiment. FIG. 7 is a cross-sectional view schematically illustrating a glass layer 412 when an electronic device 100 is in an unfolded state according to an embodiment. FIG. 8 is a cross-sectional view schematically illustrating a glass layer 412 according to another embodiment.

The glass layer 412 shown in FIGS. 6 to 8 may be at least partially similar to the glass layer 412 shown in FIG. 5, or may include other embodiments. Hereinafter, only the characteristics of the glass layer 412 that were not described in FIG. 5 or differ therefrom will be described with reference to FIGS. 6 to 8.

Referring to FIGS. 6 to 8, the glass layer 412 according to an embodiment may be defined as including flat portions 720 and a bending portion 710. For example, the entire area of the glass layer 412 may be divided into flat portions 720 and a bending portion 710.

The flat portion 720 of the glass layer 412 may be an area that is flat when the electronic device 100 is in the folded state and is flat when the electronic device 100 is in the unfolded state. For example, the flat portion 720 may always be a flat area, regardless of the shape of the electronic device 100. The curvature of the surface of the flat portion 720 may remain constant irrespective of the shape of the electronic device 100.

The bending portion 710 of the glass layer 412 may be an area that is bent when the electronic device 100 is in the folded state and is flat when the electronic device 100 is in the unfolded state. For example, the bending portion 710 may be an area that is bent only when the electronic device 100 is in the folded state. The curvature of bending portion 710 may vary when switching from the unfolded state to the folded state or from the folded state to the unfolded state. The bending portion 710 of the glass layer 412 may substantially overlap at least a portion of the folding area (e.g., the folding area 130*c* in FIG. 1) of the electronic device 100.

The bending portion 710 may be positioned close to the center c of the glass layer 412. For example, as the bending portion 710 is positioned at the center c in the glass layer 412, the flat portions 720 of the glass layer 412 may be disposed on both sides of the bending portion 710. The center c of the bending portion 710 may be substantially the same as the center c of the glass layer 412.

The flat portion 720 of the glass layer 412 may be divided into an area that is adjacent to the bending portion 710 to form a boundary and an area that is not adjacent to the bending portion 710. The flat portion 720 may include a first flat portion 721 adjacent to the bending portion 710, thereby forming a boundary, and a second flat portion 722 disposed to extend from the first flat portion 721 to the edge of the glass layer 412.

According to an embodiment, as the bending portion 710 is positioned at the center c in the glass layer 412, the first flat portion 721 of the flat portions 720 may include a first portion 721a adjacent to one end of the bending portion 710 and a second portion 721b adjacent to the opposite end of the bending portion 710.

The second flat portion 722 of the flat portions 720 may include a third portion 722a extending from the first portion 721a to one edge of the glass layer 412 and a fourth portion 722b extending from the second portion 721b to the opposite edge of the glass layer 412.

According to certain embodiments, the stacked structure of the glass layer 412 may include a glass member 610 and a filling member 620.

The glass member 610 may include a polymer film or a glass material. The glass member 610 may include PI, PET, or UTG (ultra-thin glass).

The filling member 620 may be formed of a synthetic resin (e.g., resin), and the synthetic resin may include, for example, at least one of acryl, epoxy, silicone, and urethane. The filling member 620 may include an optical clear resin (OCR). The filling member 620 may be formed of a material having higher ductility than the glass member 610.

The glass member 610 may be disposed to be directed in a first direction (z-direction) in which the front surface (e.g., the first surface 111 and the third surface 121 in FIG. 1) of the electronic device 100 is exposed in the unfolded state. The filling member 620 may be disposed in a second direction (−z-direction) opposite the first direction (z-direction) from the glass member 610. The filling member 620 may be formed to overlap at least a portion of the glass member 610 or to overlap the entire area of the glass member 610.

According to certain embodiments, the thickness of the glass member 610 may be designed to not be constant and to decrease as it is closer to the center c of the bending portion 710. The glass member 610 may have a first thickness t1 in the flat portions 720 of the glass layer 412 such that the thickness starts to decrease from the first flat portion 721 of the flat portions 720 to a second thickness t2 (e.g., a minimum thickness) at the center c of the bending portion 710. For example, the glass member 610 may have a second thickness t2 (e.g., a minimum thickness) at the center c of the bending portion 710, and have a third thickness t3, which is less than the first thickness t1 and greater than the second thickness t2, in the section between the first flat portion 721 of the flat portion 720 and the center c of the bending portion 710.

The first thickness t1 may be double the second thickness t2 or more. For example, the second thickness t2 of the glass member 610 corresponding to the center c of the bending portion 710 may be the half of the first thickness t1 of the glass member 610, corresponding to the second flat portion 722, or less.

According to an embodiment, since the thickness of the glass member 610 decreases from the first flat portion 721 of the flat portions 720 to the center c of the bending portion 710, the glass member 610 may have an inclined surface 631 formed in the section between the first flat portion 721 of the flat portions 720 and the center c of the bending portion 710. According to an embodiment, since the thickness of the glass member 610 decreases from the first flat portion 721 of the flat portions 720 to the center c of the bending portion 710, the glass member 610 may have a concave portion 630 formed in the section between the first flat portion 721 of the flat portions 720 and the center c of the bending portion 710, and the surface of the concave portion 630 may include the inclined surface 631.

The concave portion 630 of the glass member 610 may be disposed to be directed in the second direction (−z-direction). For example, the concave portion 630 of the glass member 610 may be disposed to face the polarization layer 420 or the display panel 430 in the section between the first flat portion 721 of the flat portions 720 and the center c of the bending portion 710.

The electronic device 100 according to certain embodiments is able to reduce the user's visibility of the boundary portion of the folding area 130c and reduce cracks of the glass member 610 because the glass member 610 includes the concave portion 630. A portion in which the concave portion 630 of the glass member 610 is formed (e.g., a portion in which the inclined surface 631 is formed) is not limited to the bending portion 710, and may extend to a portion of the flat portion 720 (e.g., the first flat portion 721 of the flat portions 720), so that the electronic device 100 according to certain embodiments is able to further reduce the user's visibility of the boundary of the folding area 130c. The width w of the concave portion 630 may be greater than the width of the bending portion 710.

According to an embodiment, in the concave portion 630 of the glass member 610, the slope of the inclined surface 631 may have a value less than or equal to about ⅒. For example, assuming that the angle of the inclined surface 631 with respect to the rear surface of the glass member 610 (e.g., the surface of the glass member 610 that faces in the second direction (−z-direction)) is defined as θ, tan θ may have a value less than or equal to about ⅒.

According to another embodiment, as shown by a dotted line 791 in FIG. 7, the thickness of the glass member 610 may be maintained constant to have the second thickness t2 in the entire area of the bending portion 710, and may gradually increase from the first flat portion 721 of the flat portions 720 to the third thickness t3 that is greater than the second thickness t2 and less than the first thickness t1. For example, as shown by dotted line 791 in FIG. 7, the glass member 610 may have the inclined surface 631 in the first flat portion 721 of the flat portions 720.

The glass layer 412 may include a filling member 620 filling the concave portion 630 of the glass member 610. For example, since the concave portion 630 of the glass member 610 is disposed to face the polarization layer 420 or the display panel 430, the filling member 620 may be formed in the second direction (−z-direction) of the glass member 610. The filling member 620 may function as a flattening film to make the thickness of the glass layer 412 constant. The overall thickness of the glass layer 412 may be constant in the flat portions and the bending portion 710 because the filling member 620 fills the concave portion 630 of the glass member 610. For example, as shown in FIG. 7, the overall thickness of the glass layer 412 may be the first thickness t1, regardless of the area of the glass layer 412.

According to another embodiment, as shown in FIG. 8, the filling member 620 of the glass layer 412 may be formed to correspond to the entire area of the glass member 610, as well as filling the concave portion 630. For example, the filling member 620 may be disposed to extend from the concave portion 630 to the edge of the glass member 610. In this case, the thickness of the filling member 620 of the glass layer 412 may be a fourth thickness t4 in the flat portion 720 of the glass layer 412 (e.g., the second flat portion 722 of the flat portions 720). According to the embodiment shown in FIG. 8, the overall thickness of the glass layer 412 may be a fifth thickness t5, which is the sum of the first thickness t1 and the fourth thickness t4, regardless of the area of the glass layer 412.

Figure 9:
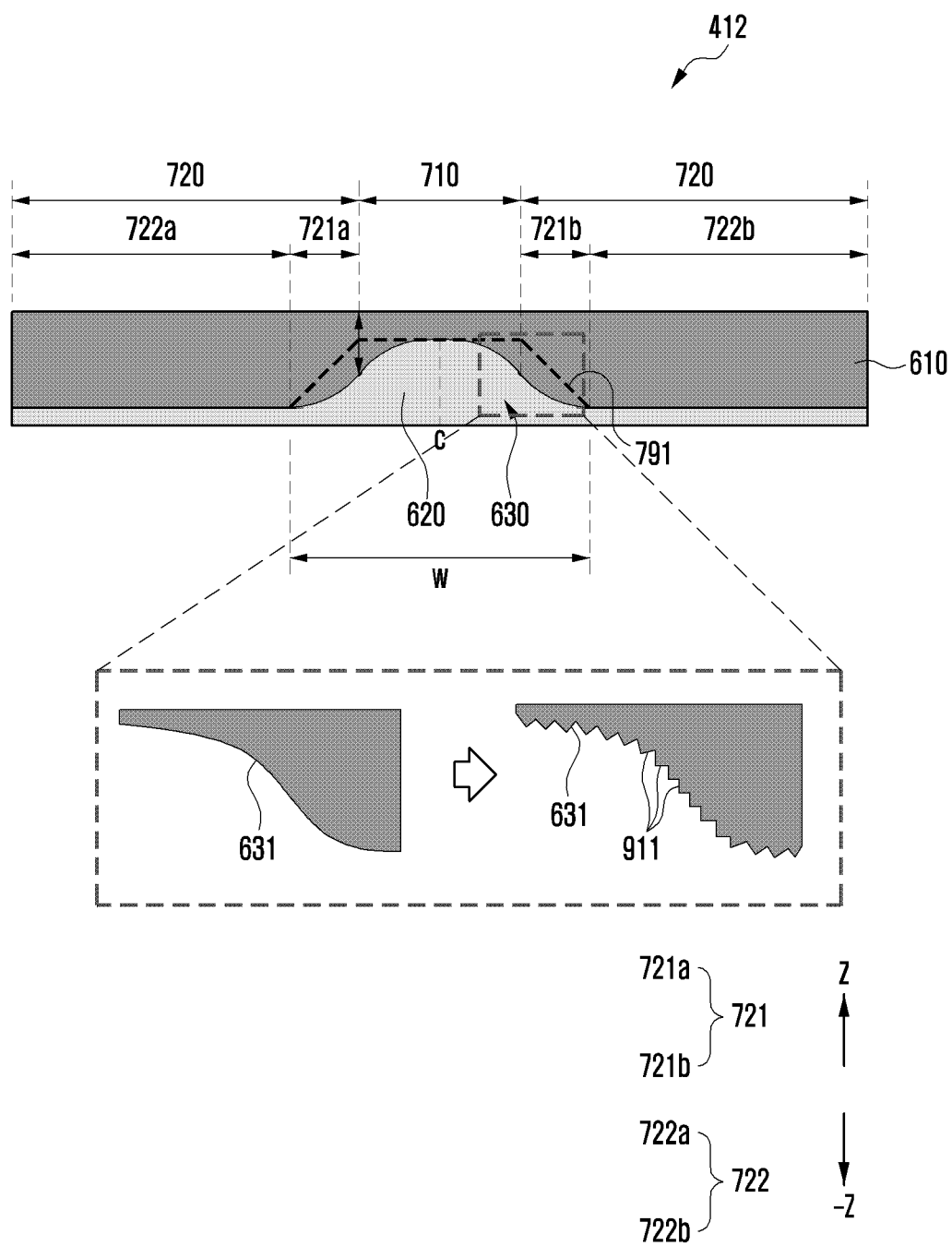
FIG. 9 is a cross-sectional view illustrating irregularities formed on a glass layer according to an embodiment.

FIG. 9 is a cross-sectional view illustrating irregularities 911 formed on a glass layer 412 according to an embodiment.

The glass layer 412 illustrated in FIG. 9 may be at least partially similar to the glass layer 412 shown in FIGS. 5 to 8, or may include other embodiments. Hereinafter, only the characteristics of the glass layer 412 that were not described in FIGS. 5 to 8 or differ therefrom will be described with reference to FIG. 9.

Referring to FIG. 9, in the glass member 610 according to an embodiment, a plurality of irregularities 911 may be formed on the surface of the concave portion 630. For example, the plurality of irregularities 911 may be formed regularly or irregularly by physical micro-pattern processing or chemical etching. Surface treatment may be performed on the glass member 610 according to certain embodiments such that a plurality of irregularities 911 is formed on the surface of the concave portion 630, thereby inducing diffused reflection of light. The electronic device 100 according to certain embodiments may further reduce the user's visibility of the boundary of a folding area (e.g., the folding area 130c in FIG. 1) using diffused reflection of light by the plurality of irregularities 911.

Figure 10:
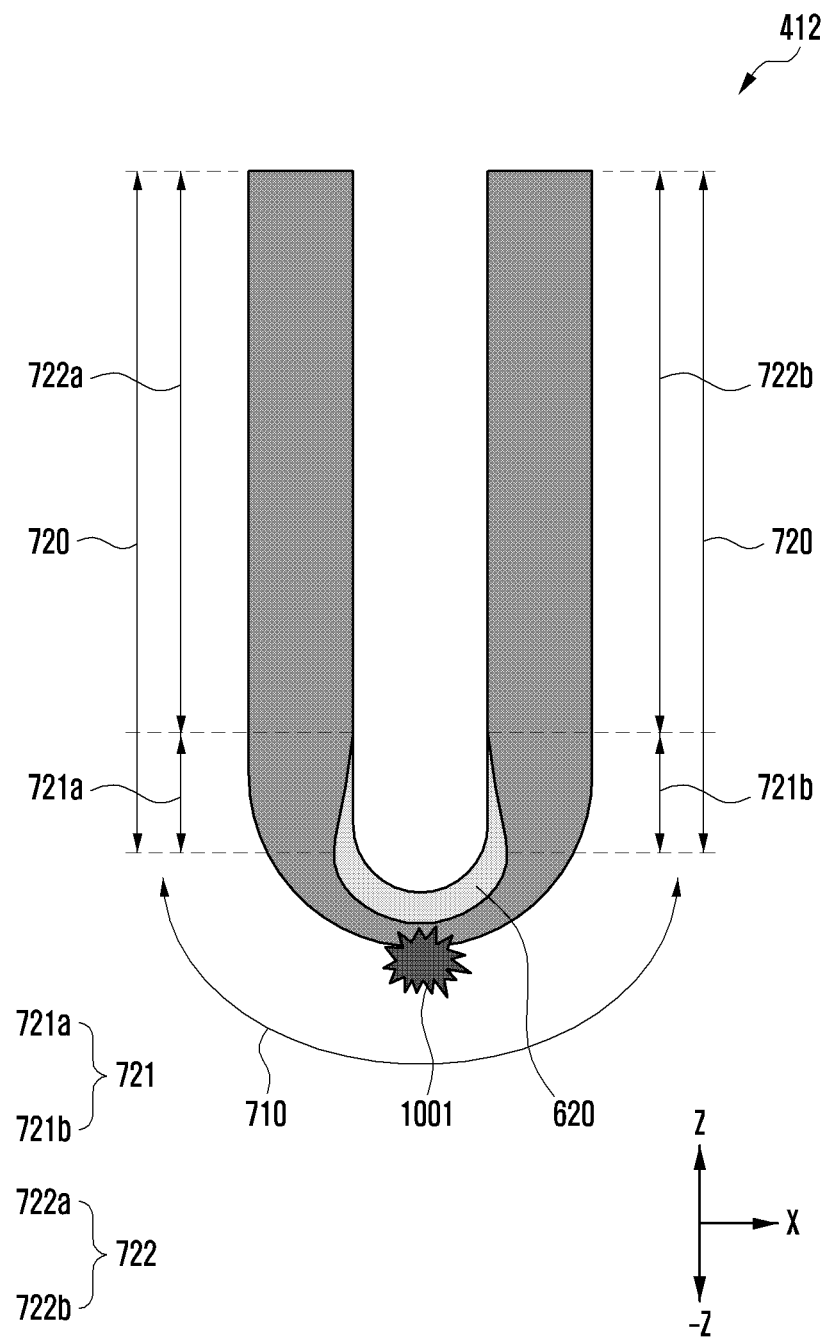
FIG. 10 is a cross-sectional view schematically illustrating a glass layer according to another embodiment.
Figure 11:
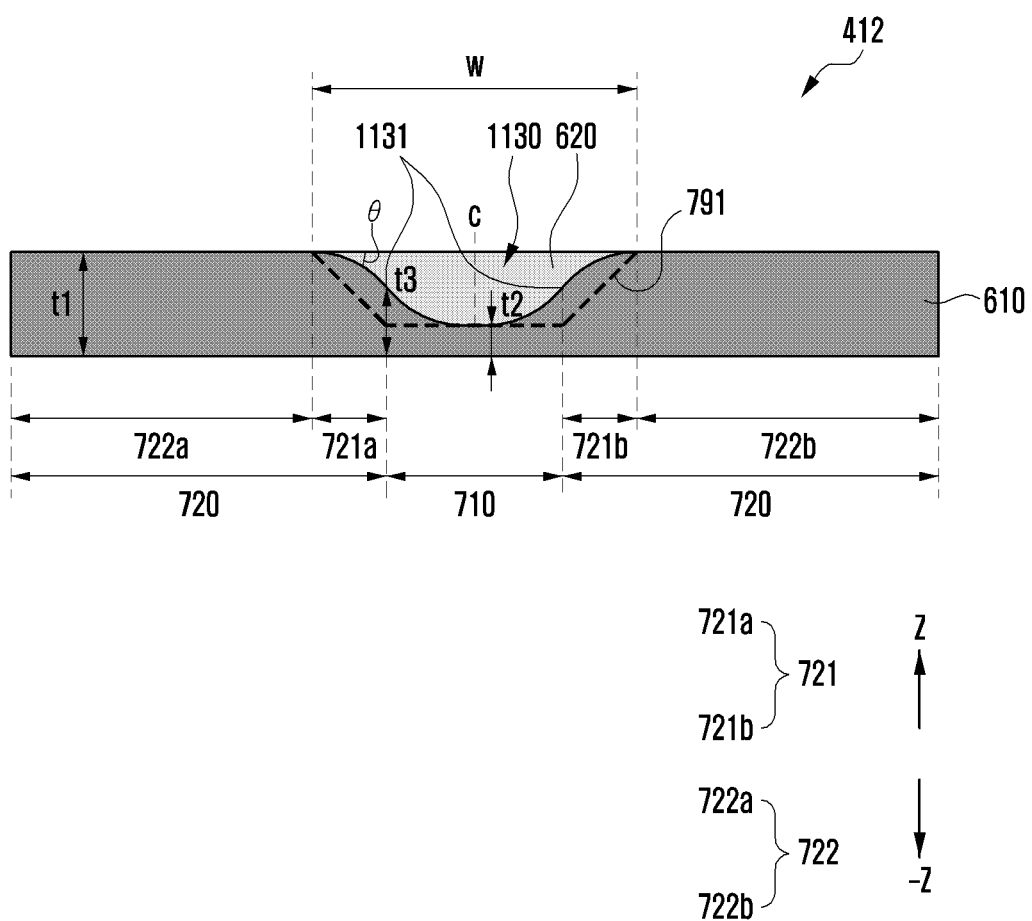
FIG. 11 is a cross-sectional view schematically illustrating a glass layer according to another embodiment.
Figure 12:
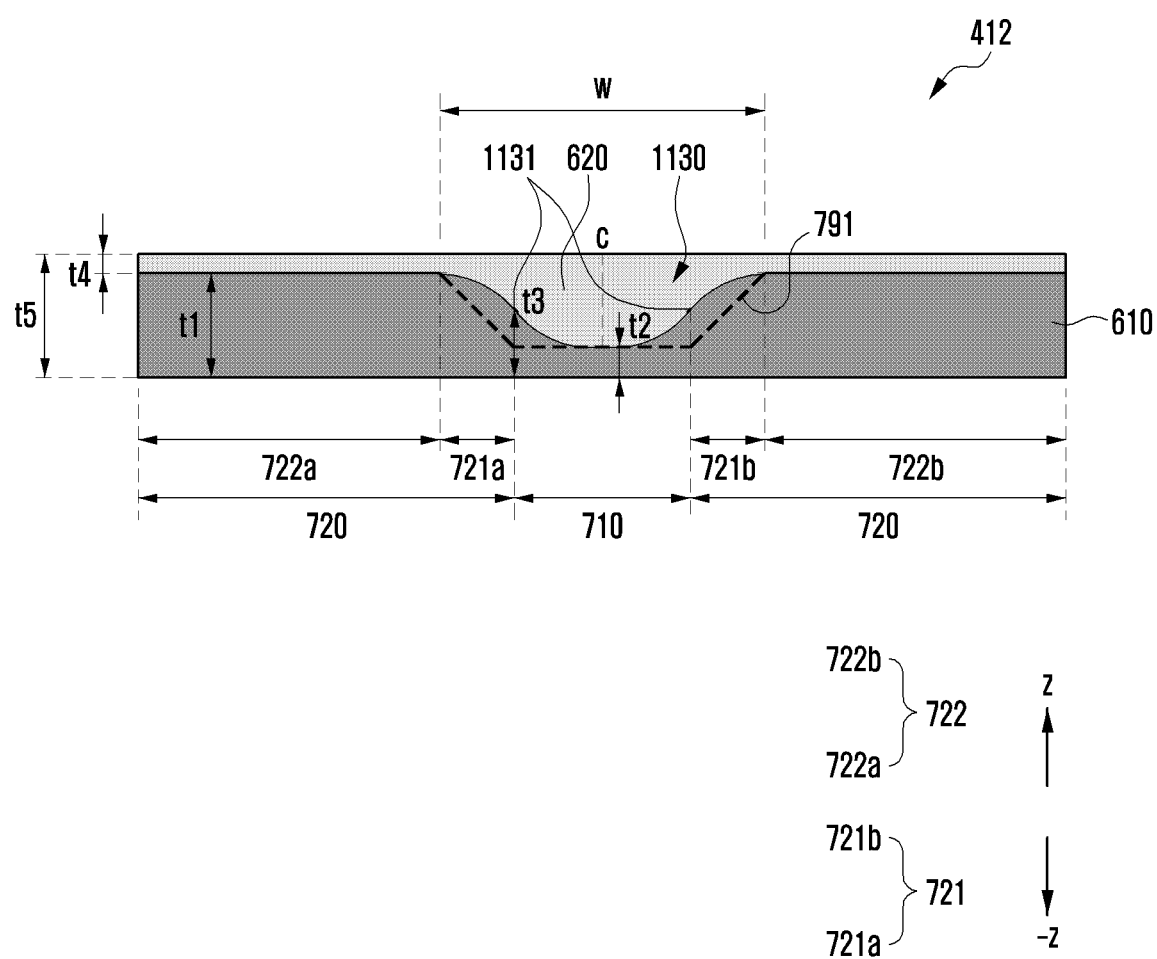
FIG. 12 is a cross-sectional view schematically illustrating a glass layer according to another embodiment.

FIG. 10 is a cross-sectional view schematically illustrating a glass layer 412 according to another embodiment. FIG. 11 is a cross-sectional view schematically illustrating a glass layer 412 according to another embodiment. FIG. 12 is a cross-sectional view schematically illustrating a glass layer 412 according to another embodiment.

The glass layer 412 illustrated in FIGS. 10 to 12 may be at least partially similar to the glass layer 412 shown in FIGS. 5 to 9, or may include other embodiments. Hereinafter, only the characteristics of the glass layer 412 that were not described in FIGS. 5 to 9 or differ therefrom will be described with reference to FIGS. 10 to 12.

Referring to FIGS. 10 to 12, a glass member 610 according to another embodiment may be disposed such that a concave portion 1130 faces in the first direction (z-direction), instead of the second direction (-z-direction). For example, unlike the glass member 610 shown in FIGS. 6 to 8, the glass member 610 shown in FIG. 10 may be disposed such that the concave portion 1130 faces in the first direction (z-direction).

According to an embodiment, since the concave portion 1130 of the glass member 610 is disposed to be directed in the first direction (z-direction), the glass member 610 may be disposed to face the polymer layer 411 (e.g., the polymer layer 411 in FIG. 5) in the section between the first flat portion 721 of the flat portions 720 and the center c of the bending portion 710.

According to an embodiment, since the thickness of the glass member 610 decreases from the first flat portion 721 of the flat portions 720 to the center c of the bending portion 710, the glass member 610 may have an inclined surface 1131 formed in the section between the first flat portion 721 of the flat portions 720 and the center c of the bending portion 710. According to an embodiment, since the thickness of the glass member 610 decreases from the first flat portion 721 of the flat portions 720 to the center c of the bending portion 710, the glass member 610 may have a concave portion 1130 formed in the section between the first flat portion 721 of the flat portions 720 and the center c of the bending portion 710, and the surface of the concave portion 1130 may include the inclined surface 1131.

The electronic device 100 according to certain embodiments is able to reduce the user's visibility of the boundary portion of a folding area (e.g., the folding area 130c in FIG. 1) and reduce cracks of the glass member 610 because the glass member 610 includes the concave portion 1130. The glass member 610 according to the embodiment shown in FIGS. 10 to 12 is able to further reduce damage to the glass member 610, compared to the glass member 610 according to the embodiment shown in FIGS. 6 to 8, because the concave portion 1130 is disposed to be directed in the first direction (z-direction). For example, as shown in FIG. 10, when the electronic device 100 is in the folded state, the stress 1001 due to tensile force may be concentrated in the second direction (-z-direction) from the bending portion 710. In the embodiment shown in FIGS. 6 to 8, since the concave portion 1130 is formed by varying the curvature of the rear surface (e.g., the surface directed in the second direction (-z-direction)) of the glass member 610, the rear surface of the glass member 610 in which the curvature is varied and the portion where the stress 1001 is concentrated may be close to each other, and thus the glass member 610 may be damaged. On the other hand, since the glass member 610 according to the embodiment shown in FIGS. 10 to 12 forms the concave portion 1130 by varying the curvature of the front surface (e.g., the surface directed in the first direction (z-direction)) of the glass member 610, the front surface of the glass member 610 in which the curvature is varied and the portion where the stress 1001 is concentrated may be spaced apart from each other, thereby reducing damage to the glass member 610.

Figure 13:
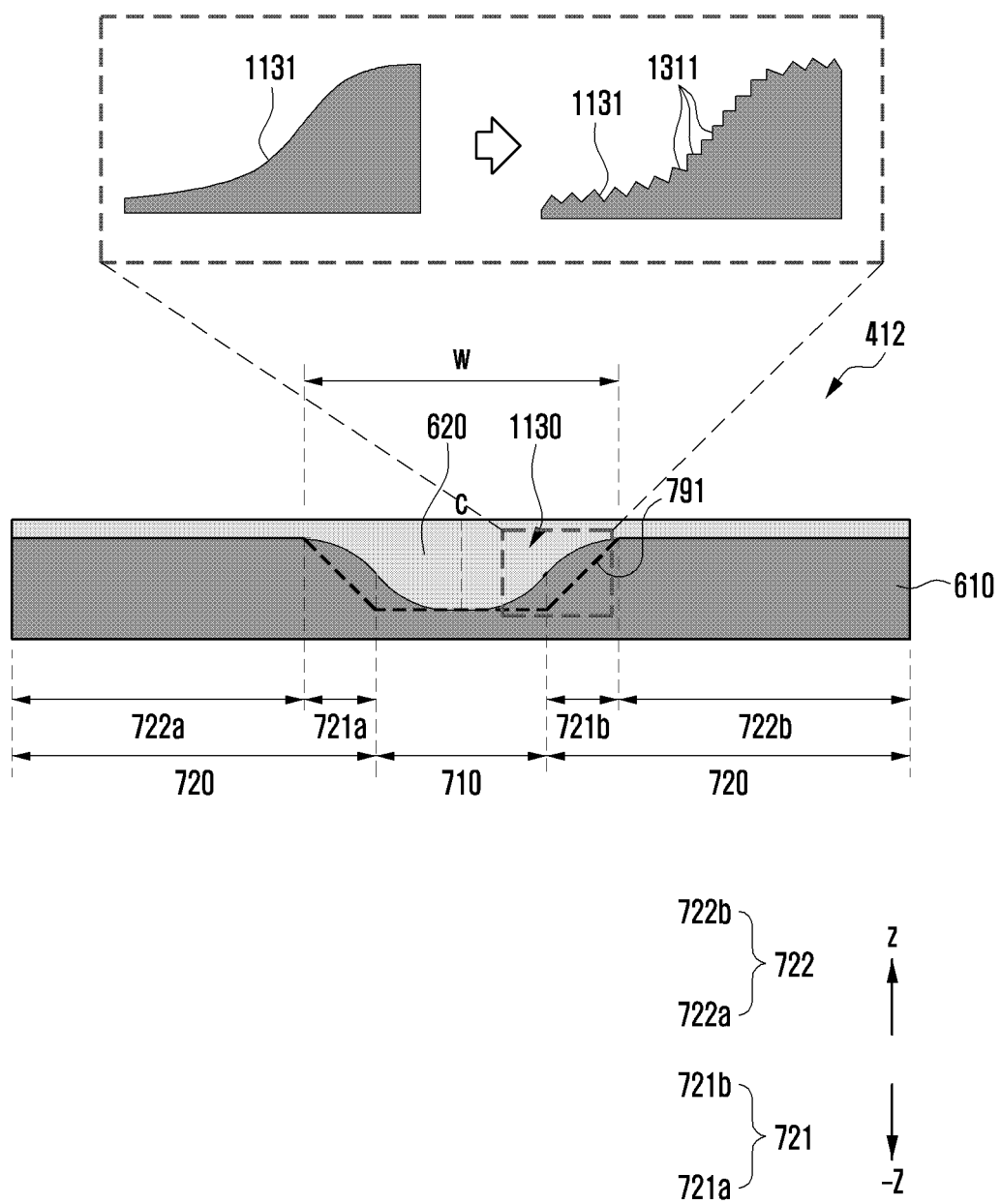
FIG. 13 is a cross-sectional view illustrating irregularities formed on a glass layer according to another embodiment.

FIG. 13 is a cross-sectional view illustrating irregularities 911 formed on a glass layer 412 according to another embodiment.

The glass layer 412 illustrated in FIG. 13 may be at least partially similar to the glass layer 412 shown in FIGS. 5 to 12, or may include other embodiments. Hereinafter, only the characteristics of the glass layer 412 that were not described in FIGS. 5 to 12 or differ therefrom will be described with reference to FIG. 13.

Referring to FIG. 13, a glass member 610 according to another embodiment may be disposed such that a concave portion 1130 is directed in the first direction (z-direction), instead of the second direction (-z-direction), and a plurality of irregularities 1311 may be formed on the surface of the concave portion 1130. For example, the plurality of irregularities 1311 may be formed regularly or irregularly by physical micro-pattern processing or chemical etching. Surface treatment may be performed on the glass member 610 according to certain embodiments so as to form a plurality of irregularities 1311 on the surface of the concave portion 1130, thereby inducing diffused reflection of light. The electronic device 100 according to certain embodiments may further reduce the user's visibility of the boundary of a folding area (e.g., the folding area 130c in FIG. 1) using diffused reflection of light by the plurality of irregularities 1311.

Figure 14:
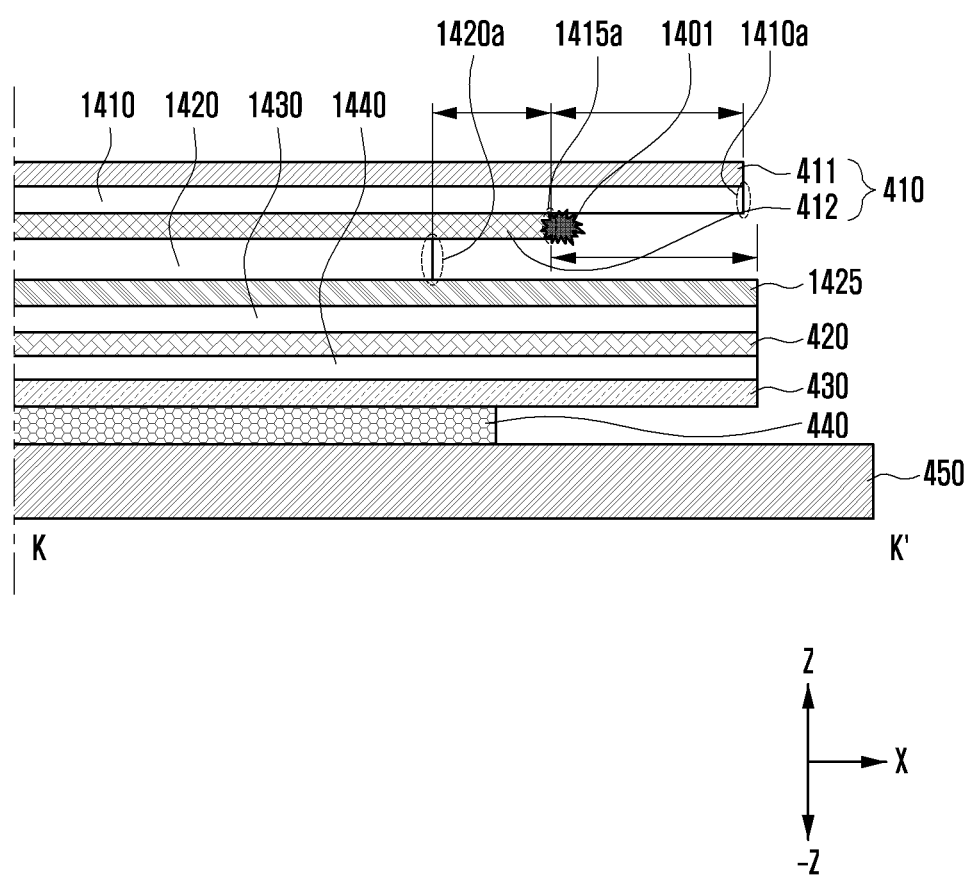
FIG. 14 is a cross-sectional view schematically illustrating an edge of a flexible display according to a comparative example.

FIG. 14 is a cross-sectional view schematically illustrating an edge of a flexible display 400 according to a comparative example. For example, FIG. 14 may be a cross-sectional view showing the edge of the flexible display 400 taken along the line k-k' in FIG. 4B.

Referring to FIG. 14, the flexible display 400 according to a comparative example may include a display panel 430, a polarization layer 420 disposed in the first direction (z-direction) from the display panel 430, a shock absorption layer 1425 disposed in the first direction (z-direction) from the polarization layer 420, a glass layer 412 (e.g., UTG) disposed in a first direction (z-direction) from the shock absorption layer 1425, and a polymer layer 411 (e.g., PET) formed in the first direction (z-direction) from the glass layer 412. The flexible display 400 according to the comparative example may further include a polymer member 440 disposed in a second direction (−z-direction) opposite the first direction (z-direction) from the display panel 430 and a conductive plate 450 disposed in the second direction (−z-direction) from the polymer member 440.

In the flexible display 400 according to the comparative example, the polymer layer 411 and the glass layer 412 may be attached to each other by a first adhesive 1410 disposed between the polymer layer 411 and the glass layer 412.

In the flexible display 400 according to the comparative example, the glass layer 412 and the shock absorption layer 1425 may be attached to each other by a second adhesive 1420 disposed between the glass layer 412 and the shock absorption layer 1425.

In the flexible display 400 according to the comparative example, the shock absorption layer 1425 and the polarization layer 420 may be attached to each other by a third adhesive 1430 disposed between the shock absorption layer 1425 and the polarization layer 420.

In the flexible display 400 according to the comparative example, the polarization layer 420 and the display panel 430 may be attached to each other by a fourth adhesive 1440 between the polarization layer 420 and the display panel 430.

In the flexible display 400 according to the comparative example, at the edge of the flexible display 400, an end 1415a (e.g., an edge portion) of the glass layer 412 may be disposed to protrude further in a side direction (x-direction) than an end 1420a (e.g., an edge portion) of the second adhesive 1420. For example, the area of the glass layer 412 according to the comparative example may be greater than the area of the second adhesive 1420, and the end 1415a of the glass layer 412 may be disposed to protrude further in the side direction (x-direction) than the end 1420a of the second adhesive 1420. The side direction (x-direction) is a third direction (x-direction) perpendicular to the first direction (z-direction) and the second direction (−z-direction), and may be defined as a direction in which the flexible display 400 faces a side member (e.g., the first side member 113 or the second side member 123 in FIG. 1) of the electronic device 100.

In the flexible display 400 according to the comparative example, since the end 1415a of the glass layer 412 protrudes further in the side direction (x-direction) than the end 1420a of the second adhesive 1420, the edge of the glass layer 412 may be easily damaged 1401 by an external force. Hereinafter, a structure of the flexible display 400 for preventing the edge of the glass layer 412 from being easily damaged 1401 by an external force will be described in detail with reference to FIGS. 15 to 20. For example, as will be described later with reference to FIGS. 15 to 20, at least one of the adhesives or components disposed in the first direction (z) or the second direction (−z) of the glass layer 412 may have an end that is formed to match the end of the glass layer 412 or to be greater than the same.

Figure 15:
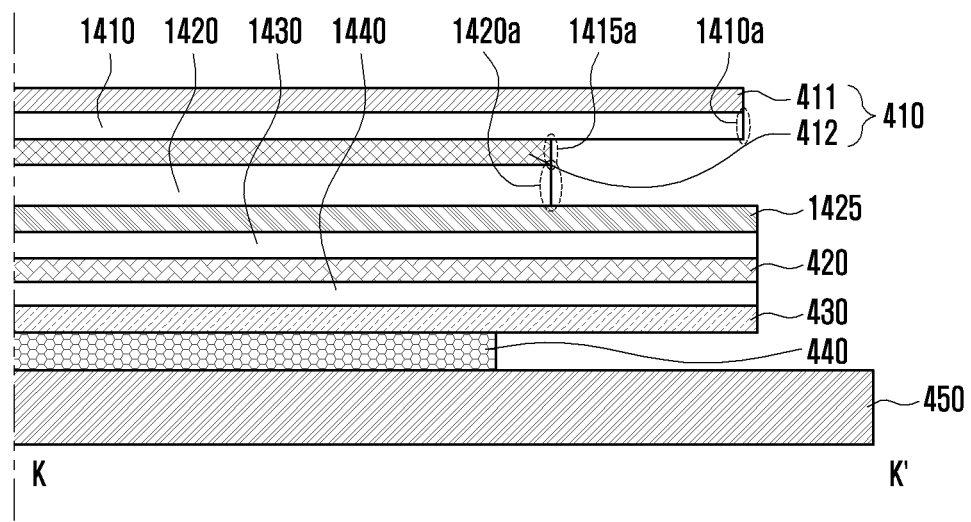
FIG. 15 is a cross-sectional view schematically illustrating an edge of a flexible display according to an embodiment.

FIG. 15 is a cross-sectional view schematically illustrating an edge of a flexible display 400 according to an embodiment. For example, FIG. 15 may be a cross-sectional view showing the edge of the flexible display 400 taken along the line k-k' in FIG. 4B.

The flexible display 400 shown in FIG. 15 may be at least partially similar to the flexible display 400 shown in FIG. 5, or may include other embodiments. The glass layer 412 shown in FIG. 15 may be at least partially similar to the glass layer 412 shown in FIGS. 5 to 13, or may include other embodiments. Hereinafter, only the characteristics of the flexible display 400 that were not described in FIG. 5 or differ therefrom will be described with reference to FIG. 15.

Referring to FIG. 15, the flexible display 400 according to an embodiment may include a display panel 430, a polarization layer 420 disposed in a first direction (z-direction) from the display panel 430, a shock absorption layer 1425 (e.g., PET) disposed in the first direction (z-direction) from the polarization layer 420, a glass layer 412 (e.g., UTG) disposed in the first direction (z-direction) from the shock absorption layer 1425, and a polymer layer 411 (e.g., PET) formed in the first direction (z-direction) from the glass layer 412. The flexible display 400 according to an embodiment may further include a polymer member 440 disposed in a second direction (−z-direction) opposite the first direction (z-direction) from the display panel 430 and a conductive plate 450 disposed in the second direction (−z-direction) from the polymer member 440.

In the flexible display 400 according to an embodiment, the polymer layer 411 and the glass layer 412 may be attached to each other by a first adhesive 1410 disposed between the polymer layer 411 and the glass layer 412.

In the flexible display 400 according to an embodiment, the glass layer 412 and the shock absorption layer 1425 may be attached to each other by a second adhesive 1420 disposed between the glass layer 412 and the shock absorption layer 1425.

In the flexible display 400 according to an embodiment, the shock absorption layer 1425 and the polarization layer 420 may be attached to each other by a third adhesive 1430 disposed between the shock absorption layer 1425 and the polarization layer 420.

In the flexible display 400 according to an embodiment, the polarization layer 420 and the display panel 430 may be attached to each other by a fourth adhesive 1440 between the polarization layer 420 and the display panel 430.

According to an embodiment, each of the first adhesive 1410 to the fourth adhesive 1440 may include at least one of an OCA (optical clear adhesive), a PSA (pressure sensitive adhesive), a heat-responsive adhesive, a general adhesive, or a double-sided tape.

Unlike the flexible display 400 according to the comparative example shown in FIG. 14, in the flexible display 400 according to the embodiment shown in FIG. 15, the end 1415a (e.g., an edge portion) of the glass layer 412 may be disposed not to protrude further in a side direction (x-direction) than the end 1420a (e.g., an edge portion) of the second adhesive 1420. For example, the end 1415a of the glass layer 412 and the end 1420a of the second adhesive 1420 may be disposed to form a straight line. The side direction (x-direction) is a third direction (x-direction) perpendicular to the first direction (z-direction) and the second direction (−z-direction), and may be defined as a direction in which the flexible display 400 faces a side member (e.g., the first side member 113 or the second side member 123 in FIG. 1) of the electronic device 100.

The area of the glass layer 412 may be substantially the same as the area of the second adhesive 1420, and the end 1415*a* of the glass layer 412 and the end 1420*a* of the second adhesive 1420 may be disposed to form a straight line at the edge of the flexible display 400.

The area of the first adhesive 1410 is greater than the area of the glass layer 412, and the end 1410*a* of the first adhesive 1410 may be disposed to protrude further in the side direction (x-direction) than the end 1415*a* of the glass layer 412.

In the flexible display 400 according to the embodiment shown in FIG. 15, the ends of the adhesives positioned in the first direction (z-direction) and in the second direction (−z-direction), respectively, from the glass layer 412 may protrude further than the end 1415*a* of the glass layer 412 or form a straight line, thereby preventing the edge of the glass layer 412 from being easily damaged by an external force.

Figure 16:
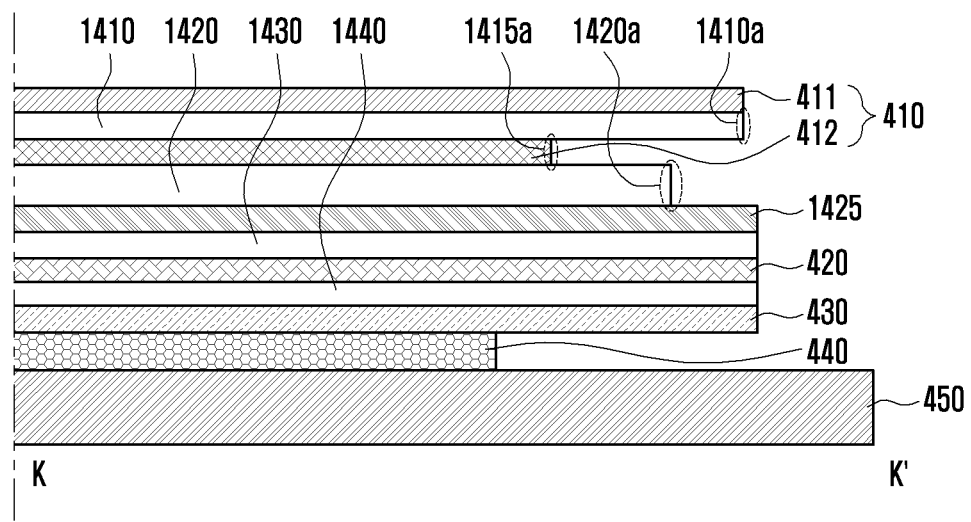
FIG. 16 is a cross-sectional view schematically illustrating an edge of a flexible display according to another embodiment.
Figure 16:
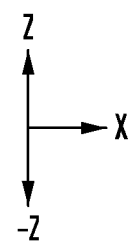

FIG. 16 is a cross-sectional view schematically illustrating an edge of a flexible display 400 according to another embodiment. For example, FIG. 16 may be a cross-sectional view showing the edge of the flexible display 400 taken along the line k-k' in FIG. 4B.

The flexible display 400 shown in FIG. 16 may be at least partially similar to the flexible display 400 shown in FIG. 15, or may include other embodiments. The glass layer 412 shown in FIG. 16 may be at least partially similar to the glass layer 412 shown in FIG. 15, or may include other embodiments. Hereinafter, only the characteristics of the flexible display 400 that were not described in FIG. 15 or differ therefrom will be described with reference to FIG. 16.

Unlike the flexible display 400 shown in FIG. 15, in the flexible display 400 according to the embodiment shown in FIG. 16, the end 1420*a* of the second adhesive 1420 may be disposed to protrude further in the side direction (x-direction) than the end 1415*a* of the glass layer 412.

The area of each of the first adhesive 1410 and the second adhesive may be greater than the area of the glass layer 412, and the end 1410*a* of the first adhesive 1410 and the end 1420*a* of the second adhesive 1420 may be disposed to protrude further in the side direction (x-direction).

In the flexible display 400 according to the embodiment shown in FIG. 16, the ends of the adhesives positioned in the first direction (z-direction) and in the second direction (−z-direction), respectively, from the glass layer 412 may protrude further than the end 1415*a* of the glass layer 412, thereby preventing the edge of the glass layer 412 from being easily damaged by an external force.

Figure 17:
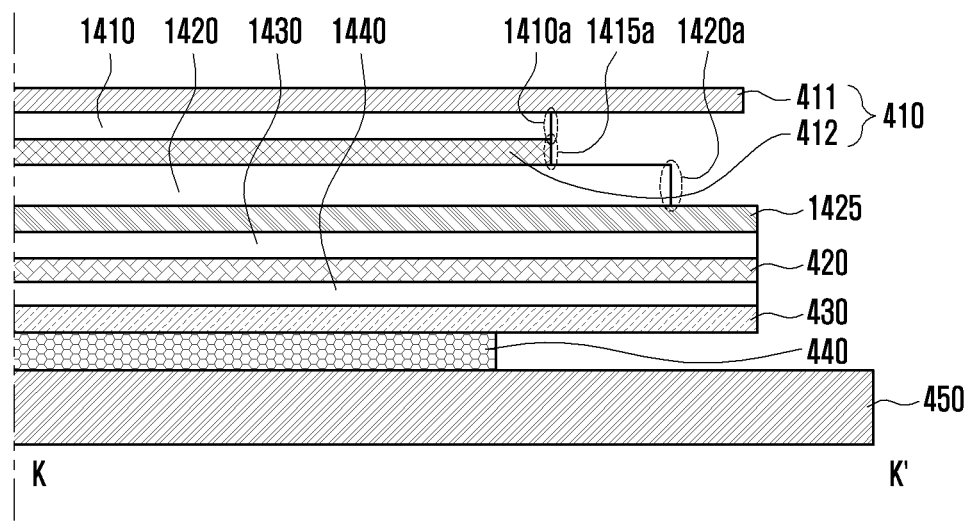
FIG. 17 is a cross-sectional view schematically illustrating an edge of a flexible display according to another embodiment.
Figure 17:
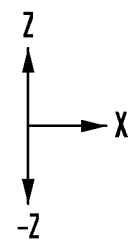

FIG. 17 is a cross-sectional view schematically illustrating an edge of a flexible display 400 according to another embodiment. For example, FIG. 17 may be a cross-sectional view showing the edge of the flexible display 400 taken along the line k-k' in FIG. 4B.

The flexible display 400 shown in FIG. 17 may be at least partially similar to the flexible display 400 shown in FIGS. 15 to 16, or may include other embodiments. The glass layer 412 shown in FIG. 17 may be at least partially similar to the glass layer 412 shown in FIG. 15, or may include other embodiments. Hereinafter, only the characteristics of the flexible display 400 that were not described in FIGS. 15 to 16 or differ therefrom will be described with reference to FIG. 17.

Unlike the flexible display 400 shown in FIG. 15, in the flexible display 400 according to the embodiment shown in FIG. 17, the end 1415*a* of the glass layer 412 and the end 1410*a* of the first adhesive 1410 may form a straight line, and the end 1420*a* of the second adhesive 1420 may be disposed to protrude further in the side direction (x-direction) than the end 1415*a* of the glass layer 412.

The area of the glass layer 412 and the area of the first adhesive 1410 may be the same, and the end 1415*a* of the glass layer 412 and the end 1410*a* of the first adhesive 1410 may be disposed to form a straight line.

The area of the second adhesive may be greater than the area of the glass layer 412, and the end 1420*a* of the second adhesive 1420 may be disposed to protrude further in the side direction (x-direction) than the end 1415*a* of the glass layer 412.

In the flexible display 400 according to the embodiment shown in FIG. 17, the ends of the adhesives positioned in the first direction (z-direction) and in the second direction (−z-direction), respectively, from the glass layer 412 may protrude further than the end 1415*a* of the glass layer 412 or form a straight line, thereby preventing the edge of the glass layer 412 from being easily damaged by an external force.

Figure 18:
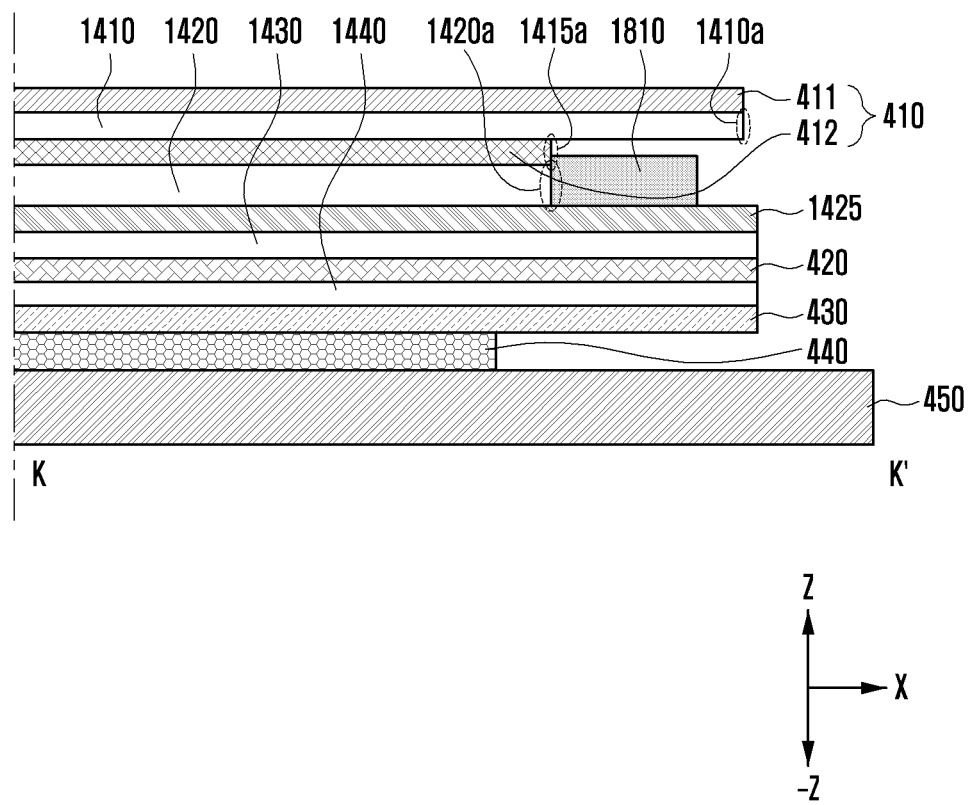
FIG. 18 is a cross-sectional view schematically illustrating an edge of a flexible display according to another embodiment.

FIG. 18 is a cross-sectional view schematically illustrating an edge of a flexible display 400 according to another embodiment. For example, FIG. 18 may be a cross-sectional view showing the edge of the flexible display 400 taken along the line k-k' in FIG. 4B.

The flexible display 400 shown in FIG. 18 may be at least partially similar to the flexible display 400 shown in FIGS. 15 to 17, or may include other embodiments. The glass layer 412 shown in FIG. 18 may be at least partially similar to the glass layer 412 shown in FIG. 15, or may include other embodiments. Hereinafter, only the characteristics of the flexible display 400 that were not described in FIGS. 15 to 17 or differ therefrom will be described with reference to FIG. 18.

Unlike the flexible display 400 shown in FIG. 15, in the flexible display 400 according to the embodiment shown in FIG. 18, an adhesive member 1810 may be further disposed in the side direction (x-direction) from the end 1420*a* of the second adhesive 1420 and the end 1415*a* of the glass layer 412.

The adhesive member 1810 may be disposed in the first direction (z-direction) from the shock absorption layer 1425 at the edge of the flexible display 400. The material of the adhesive member 1810 may include the same or similar material as the material of the first adhesive 1410 to the fourth adhesive 1440. For example, the material of the adhesive member 1810 may include PSA or resin.

The adhesive member 1810 may be disposed at the edge of the flexible display 400 in the side direction (x-direction) from the end 1415*a* of the glass layer 412, thereby performing a function of protecting the edge of the glass layer 412.

The thickness of the adhesive member 1810 may be greater than the thickness of the second adhesive 1420.

Figure 19:
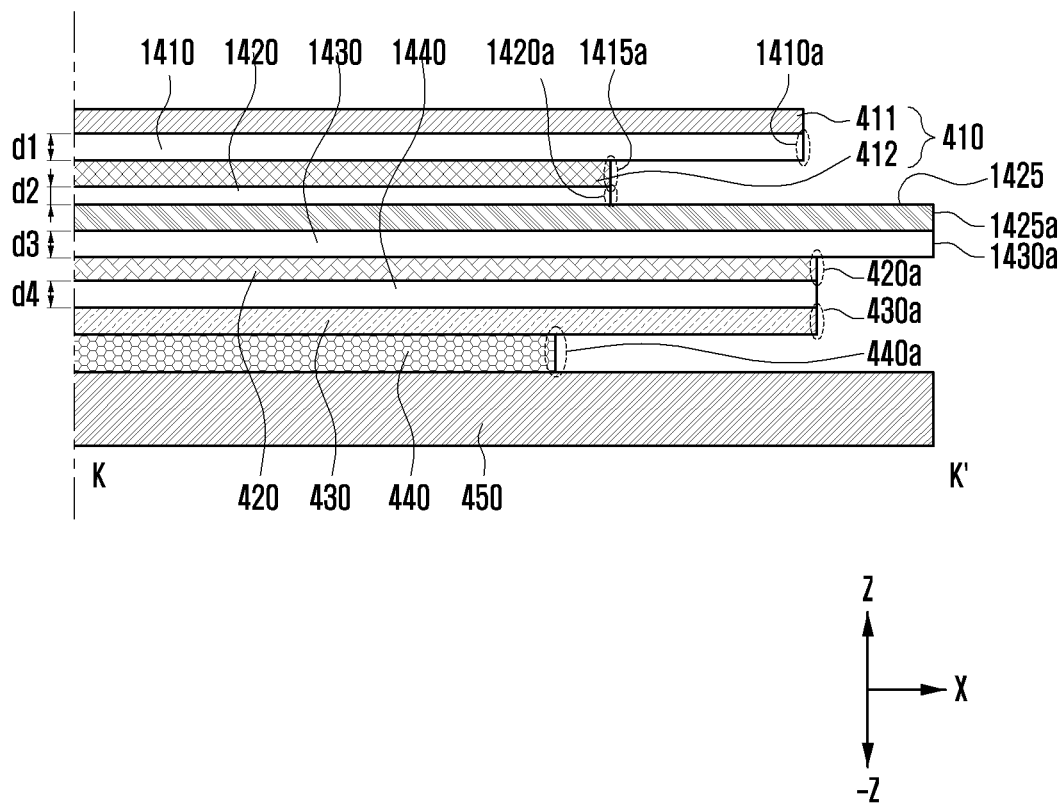
FIG. 19 is a cross-sectional view schematically illustrating an edge of a flexible display according to another embodiment.
Figure 20:
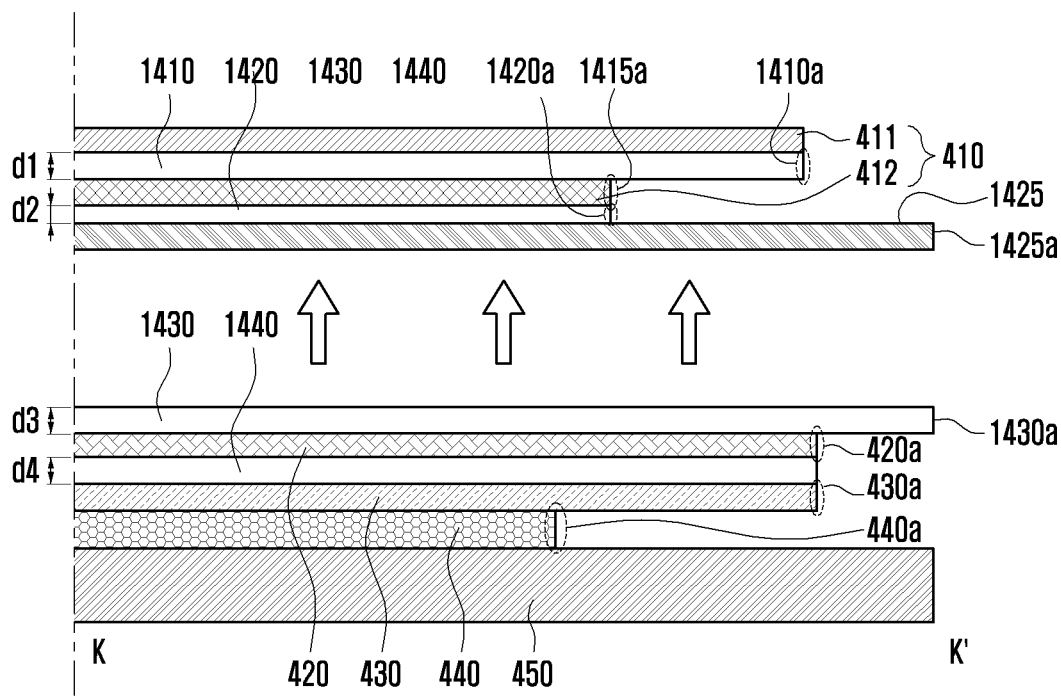
FIG. 20 illustrates a method of peeling a glass layer from the flexible display shown in FIG. 19.

FIG. 19 is a cross-sectional view schematically illustrating an edge of a flexible display 400 according to another embodiment. FIG. 20 illustrates an example of a method of peeling the glass layer 412 from the flexible display 400 shown in FIG. 19. For example, FIG. 19 may be a cross-sectional view illustrating the edge of the flexible display 400 taken along the line k-k' in FIG. 4B.

The flexible display 400 shown in FIGS. 19 and 20 may be at least partially similar to the flexible display 400 shown in FIGS. 15 to 18, or may include other embodiments. The glass layer 412 shown FIGS. 19 and 20 may be at least partially similar to the glass layer 412 shown in FIGS. 5 to 13, or may include other embodiments. Hereinafter, only the characteristics of the flexible display 400 that were not described in FIGS. 15 to 18 or differ therefrom will be described with reference to FIGS. 19 and 20.

Unlike the flexible display 400 shown in FIG. 15, in the flexible display 400 according to the embodiment shown in FIGS. 19 and 20, the end 1425a of the shock absorption layer 1425 and the end 1430a of the third adhesive 1430 may protrude further in the side direction (x-direction) than the end of the polarization layer 420, the end 1440a of the fourth adhesive 1440, and the end 430a of the display panel 430.

The area of the shock absorption layer 1425 may be greater than the area of the polarization layer 420, the area of the fourth adhesive 1440, and the area of the display panel 430. The end 1425a of the shock absorption layer 1425 may protrude further in the side direction (x-direction) than the end of the polarization layer 420, the end 1440a of the fourth adhesive 1440, and the end 430a of the display panel 430.

The area of the shock absorption layer 1425 and the area of the third adhesive 1430 may be the same, and the end 1425a of the shock absorption layer 1425 and the end 1430a of the third adhesive 1430 may form a straight line.

The area of the polarization layer 420, the area of the fourth adhesive 1440, and the area of the display panel 430 may be the same. The end of the polarization layer 420, the end 1440a of the fourth adhesive 1440, and the end 430a of the display panel 430 may form a straight line.

The thickness d2 of the second adhesive 1420 may be less than the thickness of each of the first adhesive 1410, the third adhesive 1430, and the fourth adhesive 1440. For example, the thickness d2 of the second adhesive 1420 may be designed to be less than the thickness d1 of the first adhesive 1410 by 5 μm or more. The thickness d2 of the second adhesive 1420 may be designed to be less than the thickness d3 of the third adhesive 1430 by 5 μm or more. The thickness d2 of the second adhesive 1420 may be designed to be less than the thickness d4 of the fourth adhesive 1440 by 5 μm or more. The thickness d2 of the second adhesive 1420 disposed in the second direction (−z-direction) from the glass layer 412 may be less than the thickness of each of the first adhesive 1410, the third adhesive 1430, and the fourth adhesive 1440, thereby increasing the resistance of the glass layer 412 against the external force and reducing damage to the glass member (e.g., UTG, the glass member 610 in FIG. 6).

In general, in the case of a foldable electronic device 100 including the UTG as a glass member of the glass layer 412, when the UTG is damaged, it may be difficult to peel only the damaged glass layer 412 from the flexible display 400 because of the fragments of the UTG. The user must replace the whole of the flexible display 400 when the UTG is damaged due to the above difficulties, which may increase repair costs.

In the flexible display 400 according to the embodiment shown in FIGS. 19 and 20, since the end 1425a of the shock absorption layer 1425 and the end 1430a of the third adhesive 1430 may be disposed to protrude further in the side direction (x-direction) than the end of the polarization layer 420, the end 1440a of the fourth adhesive 1440, and the end 430a of the display panel 430, it is possible to peel only some layers including the glass layer 412 from the flexible display 400 and replace the same when the glass member 610 (e.g., UTG, the glass member 610 in FIG. 6) is damaged.

The flexible display 400 according to the embodiment shown in FIGS. 19 and 20 may be designed such that the high-temperature adhesion of the third adhesive 1430 disposed in the second direction (−z-direction) from the shock absorption layer 1425 is relatively low in order to facilitate peeling only some layers including the glass layer 412 from the flexible display 400 and replacing the same. For example, the high-temperature adhesion of the third adhesive 1430 may be lower than the high-temperature adhesion of each of the first adhesive 1410, the second adhesive 1420, and the fourth adhesive 1440.

The adhesion of each of the first adhesive 1410, the second adhesive 1420, and the fourth adhesive 1440 may be 450 gf/in or more at room temperature.

The adhesion of each of the first adhesive 1410, the second adhesive 1420, and the fourth adhesive 1440 may be greater than 150 gf/in at a high temperature. The high temperature may be defined as, for example, a temperature of about 70 degrees to about 80 degrees.

The adhesion of the third adhesive 1430 may be 450 gf/in or more at room temperature.

The adhesion of the third adhesive 1430 may be less than or equal to 150 gf/in at a high temperature.

The third adhesive 1430 may react to UV (ultraviolet ray) light or laser in a specified wavelength band to be reduced in the adhesion thereof compared to each of the first adhesive 1410, the second adhesive 1420, and the fourth adhesive 1440.

The third adhesive 1430 may include a photoinitiator component that reacts to UV light or laser.

The electronic device according to certain embodiments of the disclosure is able to protect glass from an external impact and reduce a phenomenon in which a curved surface of the flexible display is observed with the naked eye in the folded portion of the flexible display, which is positioned at the boundary between the first housing and the second housing.

In addition to this, various effects that are directly or indirectly recognized through the disclosure may be provided.

According to certain embodiments, an electronic device comprises a first housing; a second housing; a hinge disposed between the first housing and the second housing such that the second housing is foldable at one end of the first housing; and a flexible display disposed on a surface of the first housing and a surface of the second housing, wherein the flexible display comprises a display panel, and a glass layer disposed on the display panel, such that the display panel is between the glass layer and the surface of the first housing and the surface of the second housing, wherein the glass layer comprises: a bendable portion configured to be flat in an unfolded state when the first housing and the second housing are disposed horizontally adjacent, and to be bent in a folded state when the first housing and the second housing are vertically adjacent; and a first flat portion adjacent to the bending portion to form a boundary and a second flat portion disposed to extend from the first flat portion to an edge of the glass layer, wherein the glass layer comprises a glass member, wherein the glass member has a first thickness in the second flat portion, has a second thickness at the center of the bending portion, and has a third thickness less than the first thickness and greater than the second thickness in a section between the first flat portion and the center of the bending portion, and wherein the thickness of the glass member gradually decreases from the first flat portion to the center of the bending portion forming a concave portion.

According to certain embodiments, the glass member includes ultra-thin glass (UTG), and wherein a width of the concave portion is greater than a width of the bending portion.

According to certain embodiments, the surface of the concave portion has an inclined surface, and wherein when the angle of the inclined surface with respect to the surface of the second flat portion is defined as θ, and wherein tan θ is less than or equal to 1/10.

According to certain embodiments, regular irregularities are formed on the inclined surface of the concave portion.

According to certain embodiments, irregular irregularities are formed on the inclined surface of the concave portion.

According to certain embodiments, the first thickness is at least double the second thickness.

According to certain embodiments, the concave portion is formed in the first direction from the glass layer.

According to certain embodiments, the concave portion is formed in a second direction opposite the first direction from the glass layer.

According to certain embodiments, the adhesive member is formed in the third direction from the end of the glass layer so as to correspond between the first adhesive and the shock absorption layer.

According to certain embodiments, the area of the shock absorption layer is greater than the area of the display panel, wherein the area of a third adhesive disposed between the shock absorption layer and the display panel is greater than the area of the display, and wherein at at least one edge of the flexible display, an end of the shock absorption layer and an end of the third adhesive protrude from an end of the display panel in a third direction perpendicular to the first direction.

According to certain embodiments, the high-temperature adhesion of the third adhesive is less than the high-temperature adhesion of each of the first adhesive and the second adhesive.

According to certain embodiments, the third adhesive comprises a photoinitiator component to react to UV (ultraviolet ray) light or laser in a specified wavelength band, thereby lowering the adhesion.

According to certain embodiments, a thickness of the second adhesive is less than a thickness of the first adhesive.

According to certain embodiments, the flexible display further comprises: a polarization layer disposed between the display panel and the glass layer; a shock absorption layer disposed between the polarization layer and the glass layer; and a polymer layer disposed in the first direction from the glass layer, wherein the area of a first adhesive disposed between the glass layer and the polymer layer is greater than or equal to the area of the glass layer, and wherein the area of a second adhesive disposed between the glass layer and the shock absorption layer is greater than or equal to the area of the glass layer.

According to certain embodiments, the area of the first adhesive disposed between the glass layer and the polymer layer is greater than the area of the glass layer, wherein the area of the second adhesive disposed between the glass layer and the shock absorption layer is equal to the area of the glass layer, and wherein at at least one edge of the flexible display, an end of the first adhesive protrudes from an end of the glass layer in a third direction perpendicular to the first direction, and an end of the second adhesive and the end of the glass layer are disposed to form a straight line.

According to certain embodiments, the area of the first adhesive disposed between the glass layer and the polymer layer is greater than the area of the glass layer, wherein the area of the second adhesive disposed between the glass layer and the shock absorption layer is greater than the area of the glass layer, and wherein at at least one edge of the flexible display, an end of the first adhesive protrudes from an end of the glass layer in a third direction perpendicular to the first direction, and an end of the second adhesive protrudes in the third direction from the end of the glass layer.

According to certain embodiments, the area of the first adhesive disposed between the glass layer and the polymer layer is the same as the area of the glass layer, wherein the area of the second adhesive disposed between the glass layer and the shock absorption layer is greater than the area of the glass layer, and wherein at at least one edge of the flexible display, an end of the first adhesive and an end of the glass layer are disposed to form a straight line, and an end of the second adhesive protrudes from the end of the glass layer in a third direction perpendicular to the first direction.

According to certain embodiments, a glass layer for a flexible display of a foldable electronic device, the glass comprises: a bending portion configured to be bent in a folded state of the foldable electronic device; and a first flat portion adjacent to the bending portion to form a boundary and a second flat portion disposed to extend from the first flat portion to an edge of the glass layer, a glass member, wherein the glass member has a first thickness in the second flat portion, has a second thickness at the center of the bending portion, and has a third thickness less than the first thickness and greater than the second thickness in a section between the first flat portion and the center of the bending portion, and wherein the thickness of the glass member gradually decreases from the first flat portion to the center of the bending portion to form a concave portion.

According to certain embodiments, glass member comprises UTG (ultra-thin glass), and wherein a width of the concave portion is greater than a width of the bending portion.

According to certain embodiments, an inclined surface is formed on the surface of the concave portion, and wherein when the angle of the inclined surface with respect to the surface of the second flat portion is defined as θ, and tan θ is less than or equal to 1/10.

The embodiments disclosed herein are proposed for description and understanding of the disclosed technology and does not limit the scope of the disclosure. Accordingly, the scope of the disclosure should be interpreted as including all changes or various embodiments based on the technical spirit of the disclosure.

The invention claimed is:

1. An electronic device comprising:
   a first housing;
   a second housing;
   a hinge disposed between the first housing and the second housing such that the second housing is foldable at one end of the first housing; and
   a flexible display disposed on a surface of the first housing and a surface of the second housing, wherein the flexible display comprises a display panel, and a glass layer disposed on the display panel, such that the display panel is between the glass layer and the surface of the first housing and the surface of the second housing,
   wherein the glass layer comprises:
   a bending portion configured to be flat in an unfolded state when the first housing and the second housing are disposed horizontally adjacent, and to be bent in a folded state when the first housing and the second housing are vertically adjacent; and
   a first flat portion adjacent to the bending portion to form a boundary and a second flat portion disposed to extend from the first flat portion to an edge of the glass layer,
   wherein the glass layer comprises a glass member, wherein the glass member has a first thickness in the second flat portion, has a second thickness at a center of the bending portion, and has a third thickness less than the first thickness and greater than the second thickness in a section between the first flat portion and the center of the bending portion, and wherein the thickness of the glass member gradually decreases from the first flat portion to the center of the bending portion forming a concave portion.

2. The electronic device of claim 1, wherein the glass member includes ultra-thin glass (UTG), and wherein a width of the concave portion is greater than a width of the bending portion.

3. The electronic device of claim 1, the surface of the concave portion has an inclined surface, and wherein when an angle of the inclined surface with respect to the surface of the second flat portion is defined as θ, and wherein tan θ is less than or equal to 1/10.

4. The electronic device of claim 3, wherein regular irregularities are formed on the inclined surface of the concave portion.

5. The electronic device of claim 3, wherein irregular irregularities are formed on the inclined surface of the concave portion.

6. The electronic device of claim 1, wherein the first thickness is at least double the second thickness.

7. The electronic device of claim 1, wherein the concave portion is formed in a first direction from the glass layer.

8. The electronic device of claim 1, wherein the concave portion is formed in a second direction opposite a first direction from the glass layer.

9. The electronic device of claim 1, wherein the flexible display further comprises:

a polarization layer disposed between the display panel and the glass layer;

a shock absorption layer disposed between the polarization layer and the glass layer; and a polymer layer disposed in a first direction from the glass layer, wherein an area of a first adhesive disposed between the glass layer and the polymer layer is greater than or equal to the area of the glass layer, and wherein an area of a second adhesive disposed between the glass layer and the shock absorption layer is greater than or equal to the area of the glass layer.

10. The electronic device of claim 9, wherein the area of the first adhesive disposed between the glass layer and the polymer layer is greater than the area of the glass layer, wherein the area of the second adhesive disposed between the glass layer and the shock absorption layer is equal to the area of the glass layer, and wherein at at least one edge of the flexible display, an end of the first adhesive protrudes from an end of the glass layer in a third direction perpendicular to the first direction, and an end of the second adhesive and the end of the glass layer are disposed to form a straight line.

11. The electronic device of claim 9, wherein the area of the first adhesive disposed between the glass layer and the polymer layer is greater than the area of the glass layer, wherein the area of the second adhesive disposed between the glass layer and the shock absorption layer is greater than the area of the glass layer, and wherein at at least one edge of the flexible display, an end of the first adhesive protrudes from an end of the glass layer in a third direction perpendicular to the first direction, and an end of the second adhesive protrudes in the third direction from the end of the glass layer.

12. The electronic device of claim 9, wherein the area of the first adhesive disposed between the glass layer and the polymer layer is the same as the area of the glass layer, wherein the area of the second adhesive disposed between the glass layer and the shock absorption layer is greater than the area of the glass layer, and wherein at at least one edge of the flexible display, an end of the first adhesive and an end of the glass layer are disposed to form a straight line, and an end of the second adhesive protrudes from the end of the glass layer in a third direction perpendicular to the first direction.

13. The electronic device of claim 10, wherein an adhesive member is formed in the third direction from the end of the glass layer so as to correspond between the first adhesive and the shock absorption layer.

14. The electronic device of claim 9, wherein the area of the shock absorption layer is greater than the area of the display panel, wherein the area of a third adhesive disposed between the shock absorption layer and the display panel is greater than the area of the flexible display, and wherein at at least one edge of the flexible display, an end of the shock absorption layer and an end of the third adhesive protrude from an end of the display panel in a third direction perpendicular to the first direction.

15. The electronic device of claim 14, wherein a high-temperature adhesion of the third adhesive is less than the high-temperature adhesion of each of the first adhesive and the second adhesive.

16. The electronic device of claim 14, wherein the third adhesive comprises a photoinitiator component to react to UV (ultraviolet ray) light or laser in a specified wavelength band, thereby lowering the adhesion.

17. The electronic device of claim 9, wherein a thickness of the second adhesive is less than a thickness of the first adhesive.

18. A glass layer for a flexible display of a foldable electronic device, the glass layer comprising:

a bending portion configured to be bent in a folded state of the foldable electronic device; and a first flat portion adjacent to the bending portion to form a boundary and a second flat portion disposed to extend from the first flat portion to an edge of the glass layer, a glass member, wherein the glass member has a first thickness in the second flat portion, has a second thickness at a center of the bending portion, and has a third thickness less than the first thickness and greater than the second thickness in a section between the first flat portion and the center of the bending portion, and wherein the thickness of the glass member gradually decreases from the first flat portion to the center of the bending portion to form a concave portion.

19. The glass layer of claim 18, wherein the glass member comprises UTG (ultra-thin glass), and wherein a width of the concave portion is greater than a width of the bending portion.

20. The glass layer of claim 18, wherein an inclined surface is formed on a surface of the concave portion, and wherein when an angle of the inclined surface with respect to a surface of the second flat portion is defined as θ, and tan θ is less than or equal to 1/10.

* * * * *